(12) United States Patent
Savas et al.

(10) Patent No.: US 11,049,692 B2
(45) Date of Patent: Jun. 29, 2021

(54) METHODS FOR TUNING PLASMA POTENTIAL USING VARIABLE MODE PLASMA CHAMBER

(71) Applicants: Mattson Technology, Inc., Fremont, CA (US); Beijing E-Town Semiconductor Technology Co., Ltd., Beijing (CN)

(72) Inventors: Stephen E. Savas, Pleasanton, CA (US); Shawming Ma, Sunnyvale, CA (US)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 0 days.

(21) Appl. No.: 16/514,464

(22) Filed: Jul. 17, 2019

(65) Prior Publication Data

US 2021/0020404 A1 Jan. 21, 2021

(51) Int. Cl.
| | |
|---|---|
| *H01L 21/3213* | (2006.01) |
| *H01L 21/311* | (2006.01) |
| *H01L 21/306* | (2006.01) |
| *H01J 37/32* | (2006.01) |
| *B81C 1/00* | (2006.01) |

(52) U.S. Cl.
CPC ........ *H01J 37/321* (2013.01); *B81C 1/00523* (2013.01); *B81C 1/00531* (2013.01); *H01J 37/32091* (2013.01); *H01J 37/32174* (2013.01); *H01J 37/32422* (2013.01); *H01J 37/32449* (2013.01); *H01L 21/306* (2013.01); *H01L 21/30604* (2013.01); *H01L 21/31111* (2013.01);

(Continued)

(58) Field of Classification Search
None
See application file for complete search history.

(56) References Cited

U.S. PATENT DOCUMENTS

| | | | |
|---|---|---|---|
| 5,534,231 | A | 7/1996 | Savas |
| 5,811,022 | A | 9/1998 | Savas et al. |

(Continued)

FOREIGN PATENT DOCUMENTS

| | | |
|---|---|---|
| EP | 1236275 | 6/2010 |
| JP | 2008198902 | 8/2008 |

OTHER PUBLICATIONS

Stephen Savas et al., U.S. Appl. No. 16/514,237, filed Jul. 17, 2019, Plasma Strip Tool With Multiple Gas Injection Zones.

(Continued)

*Primary Examiner* — Stephanie P Duclair
(74) *Attorney, Agent, or Firm* — Dority & Manning, P.A.

(57) ABSTRACT

Plasma processing apparatus and associated methods are provided. In one example, a method can include admitting a process gas into a plasma chamber. The method can include exciting with RF energy an inductive coupling element to initiate ignition of a plasma induced in the process gas. The method can include adjusting an RF voltage of an electrostatic shield located between the inductive coupling element and the plasma chamber. The electrostatic shield can have a stray capacitance to a ground reference. The method can include conducting an ion-assisted etching process on the workpiece based at least in part on the RF voltage of the electrostatic shield.

18 Claims, 8 Drawing Sheets

(52) U.S. Cl.
CPC .. *H01L 21/31116* (2013.01); *H01L 21/32136* (2013.01); *B81C 2201/0138* (2013.01)

(56) References Cited

U.S. PATENT DOCUMENTS

| | | | |
|---|---|---|---|
| 6,180,019 B1 | 1/2001 | Kazumi et al. | |
| 6,379,576 B2 | 4/2002 | Luo et al. | |
| 6,388,382 B1 | 5/2002 | Doi et al. | |
| 6,634,313 B2 | 10/2003 | Hanawa et al. | |
| 6,805,139 B1 | 10/2004 | Savas et al. | |
| 6,974,550 B2 * | 12/2005 | Benjamin | H01J 37/321 216/61 |
| 7,100,532 B2 * | 9/2006 | Pribyl | H01J 37/32082 118/723 AN |
| 9,852,887 B2 | 12/2017 | Savas et al. | |
| 2002/0005392 A1 * | 1/2002 | Luo | H01L 21/31138 216/67 |
| 2005/0214478 A1 | 9/2005 | Hanawa et al. | |
| 2014/0123895 A1 | 5/2014 | Kato et al. | |
| 2014/0251789 A1 | 9/2014 | Miller | |
| 2015/0221477 A1 | 8/2015 | Maeda et al. | |
| 2018/0358206 A1 | 12/2018 | Ma et al. | |

OTHER PUBLICATIONS

International Search Report and Written Opinion for Application No. PCT/US2020/042329, dated Oct. 27, 2020, 10 pages.

* cited by examiner

METHODS FOR TUNING PLASMA POTENTIAL USING VARIABLE MODE PLASMA CHAMBER

FIELD

The present disclosure relates generally to plasma processing using a plasma source.

BACKGROUND

Plasma processing tools can be used in the manufacture of devices such as integrated circuits, micromechanical devices, flat panel displays, and other devices. Plasma processing tools used in modern plasma etch applications are required to provide a high plasma uniformity and a plurality of plasma controls, including independent plasma profile, plasma density, and ion energy controls. Plasma processing tools can, in some cases, be required to sustain a stable plasma in a variety of process gases and under a variety of different conditions (e.g. gas flow, gas pressure, etc.).

SUMMARY

Aspects and advantages of the invention will be set forth in part in the following description, or may be obvious from the description, or may be learned through practice of the invention.

One example embodiment of the present disclosure is directed to a method for processing a workpiece. The method can include admitting a process gas into a plasma chamber. The method can include exciting with RF energy an inductive coupling element to initiate ignition of a plasma induced in the process gas. The method can include adjusting an RF voltage of an electrostatic shield located between the inductive coupling element and the plasma chamber. The electrostatic shield can have a stray capacitance to a ground reference. The method can include conducting an ion-assisted etching process on the workpiece based at least in part on the RF voltage of the electrostatic shield. Adjusting the RF voltage of the electrostatic shield can include adjusting a first tunable reactive impedance circuit coupled between the electrostatic shield and a ground reference to a condition of inductive reactance such that, in the absence of plasma, a total impedance between the electrostatic shield and the ground reference has a magnitude that is at least twice a magnitude of an impedance of the stray capacitance between the electrostatic shield and the ground reference at a frequency of the RF energy supplied to the inductive coupling element.

Variations and modifications can be made to example embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure to one of ordinary skill in the art is set forth more particularly in the remainder of the specification, including reference to the accompanying figures, in which.

DETAILED DESCRIPTION

Figure 1:
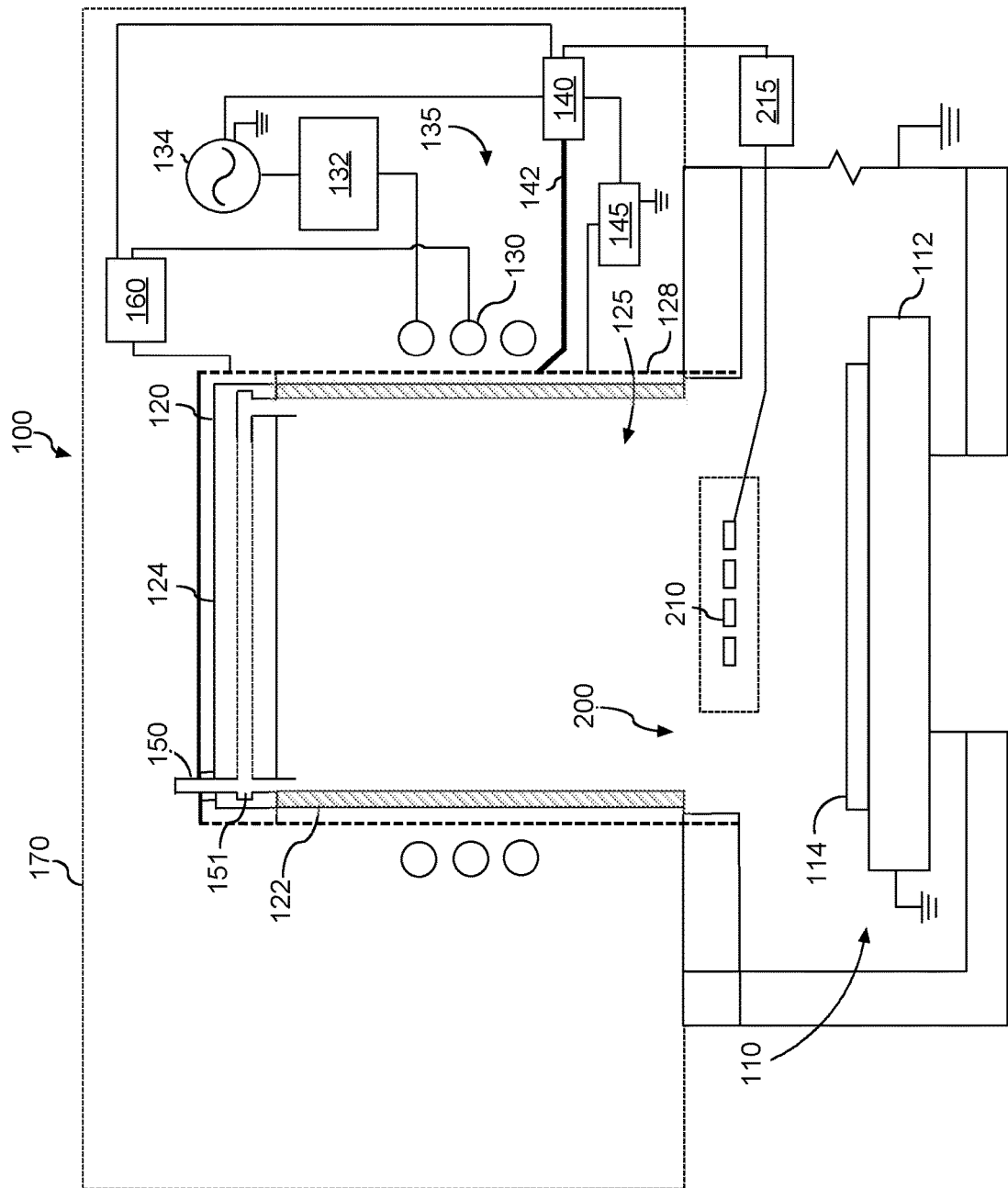
FIG. 1 depicts an example plasma processing apparatus according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to a plasma processing apparatus and associated methods. The plasma processing apparatus can include one or more inductive coupling elements (e.g., coils) used to induce an inductive plasma within a plasma chamber for processing a workpiece (e.g., performing a dry etch process or a dry strip process). The inductive coupling element(s) can be arranged proximate a dielectric window (e.g., a dielectric wall) forming a part of the plasma chamber. The inductive coupling element(s) can be energized with radio frequency (RF) energy to induce a plasma that is at least partly inductive in a process gas in the plasma chamber. The plasma processing apparatus can include an electrostatic shield (e.g., Faraday shield) arranged between the inductive coupling element(s) (e.g., antenna or coils) and the dielectric window. Structure of this electrostatic shield has a free-space or air-gap capacitance, $C_A$, to the inductive coupling element. The $C_A$ can depend on sizes of the electrostatic shield and the inductive coupling element and proximity between the electrostatic shield and the inductive coupling element. Further, there can be a stray capacitance that includes the free-space or air gap capacitance of the electrostatic shield to a grounded enclosure for the inductive coupling element and to other grounded component(s) of the chamber, $C_S$. Likewise, there can be a free-space or air-gap capacitance from a top cap of the plasma chamber to the enclosure and to the other grounded components of the chamber, $C_{T-G}$. The enclosure can be a RF enclosure (e.g., RF cage configured to reduce the radiation of electromagnetic interference into the surrounding environment.

According to example aspects of the present disclosure, the electrostatic shield can be connected to the inductive coupling element through a circuit having a tunable reactive impedance and/or can be grounded through a circuit having a tunable reactive impedance. In some embodiments, the plasma processing apparatus can include a voltage sensor configured to measure a radio-frequency component of the RF voltage of the electrostatic shield. In some example embodiments the plasma processing apparatus can include a controller to adjust reactances from the electrostatic shield to ground and from the inductive coupling element to the electrostatic shield by adjusting one or more variable capacitors in the circuits connecting the electrostatic shield to the inductive coupling element(s) and/or the electrostatic shield to ground. These can be adjusted to maintain values of capacitances in accordance with a recipe specifying values of capacitances. Further, there can be a circuit that connects the voltage sensor to the controller so that the controller can monitor the RF voltage on the electrostatic shield and thereby adjust capacitors to control the RF voltage of the electrostatic shield in accordance with a pre-programmed recipe that can specify the RF voltage of the electrostatic shield. Thus, by adjusting the tunable reactive impedances of circuits connecting the electrostatic shield to ground and/or the tunable reactive impedance of the circuit connecting the electrostatic shield to the inductive coupling element the RF voltage of the electrostatic shield can be maintained at a desired setpoint voltage.

In some instances, it can be difficult to remove certain types of materials from a workpiece (e.g., a substrate, a silicon wafer, or a thin film). Examples of materials that can be difficult to remove can include photoresists, organic materials, materials that have hardened surface layers or surface composition that interfere with isotropic, reactive radical-based removal, stripping and/or etching processes. Additionally, it can be difficult for etching chambers to etch thin films in such a manner that anisotropy of an etching process can be varied significantly and in a controlled manner during the etching process. It can also be difficult for etching chambers with capability of ion assisted processing to further provide isotropic etching at a high rate, such as greater than about 1000 nanometers (nm) per minute. Furthermore, it can be difficult to provide processing chambers configured to provide ion bombardment energies in some portion of an etching process that are very low (e.g., less than about 5 eV) so that ion bombardment is effectively isotropic, and in other portion(s) of the process at much higher ion energy, sufficient to make the ion bombardment anisotropic and thereby make the etching process directional.

Example aspects of the present disclosure are directed to a plasma processing apparatus that can include an inductive coupled plasma source with an electrostatic shield (e.g., a Faraday shield) that is connected to electrical ground through a first tunable, substantially reactive impedance. In some embodiments, the electrostatic shield can also be connected to the inductive coupling element through a second and independent tunable reactive impedance for additional control of the RF voltage on the electrostatic shield. The plasma processing apparatus can be used to process a semiconductor wafer, particularly performing either etching, stripping or plasma enhanced chemical vapor deposition (PEVCD) process(s). The plasma processing apparatus can include a controller to set and control the reactive impedances before and/or during a workpiece processing. The controller can include a sensor and circuit to measure an RF voltage of the electrostatic shield and provide the measured voltage value to the controller such that the first and second reactive impedances can be adjusted to make the measured voltage of the electrostatic shield be close to a desired setpoint for a specific period or step in a plasma process. In some embodiments, the controller can measure the RF voltage on an inner surface of the electrostatic shield at one or more locations proximate the dielectric window. In some embodiments, the electrostatic shield can include multiple shield plates. The sensor connected to the controller can measure RF voltage at one or more locations on surfaces of the shield plates.

In some embodiments, the first tunable reactive impedance of the circuit connecting the electrostatic shield to ground can be effectively in parallel with the stray capacitance from the electrostatic shield to ground. This stray capacitance, $C_S$, can come from a parallel combination of the capacitance from the electrostatic shield through any dielectric standoff or barrier as well as from the air gap capacitance of the electrostatic shield to both the process chamber walls and the RF shielding enclosure for the inductive coupling element. Varying the capacitance in the first tunable reactive impedance circuit then—effectively in parallel with the stray capacitance $C_S$—an change both the magnitude and sign (e.g., positive denoting inductive, negative denoting capacitive) of the total reactive impedance between the electrostatic shield and ground over a substantial range. In some embodiments, by varying the capacitance in the first tunable reactive impedance circuit, the RF voltage amplitude of the electrostatic shield can be varied in a range from less than about 2 $V_{RMS}$ (e.g., for impedance values less than about 10 Ohms or less) to greater than about 50 $V_{RMS}$ (e.g., for large impedance values exceeding about 100 Ohms).

During operation of the plasma source (e.g., inductive coupling element), RF magnetic fields from the inductive coupling element can penetrate through openings or gaps in the electrostatic shield and through the dielectric wall to generate an inductive electric field within the plasma chamber to sustain the plasma. In some examples, capacitive fields from the electrostatic shield and the top cover of the plasma chamber typically do not contribute more than a small percentage of the power input to the plasma. Because of the substantial free-space or air-gap stray capacitance, $C_A$, from the inductive coupling element to the electrostatic shield, there can be generally some RF current flow from the inductive coupling element to the electrostatic shield. The RF current picked up by the electrostatic shield can then flow either through the dielectric wall via capacitance $C_{S-P}$ to the plasma, through the adjustable reactive impedance to ground, or through the free-space capacitance of the electrostatic shield to the grounded enclosure and grounded components of the chamber, $C_S$.

According to example aspects of the present disclosure, because the electrostatic shield is proximate a dielectric wall of the plasma chamber, the RF voltage on the electrostatic shield can be capacitively coupled (via $C_{S-P}$) through that wall to the plasma, to which it conducts RF electric current. As a result, there can be an approximately proportional relationship between the RF voltage of the electrostatic shield and the RF plasma potential within the plasma chamber. In some implementations, accessible values of the RF voltage of the electrostatic shield by varying the first reactive circuit, based on the capacitances $C_A$ and $C_{S-P}$ are such as to permit the plasma potential to be adjusted between approximately 2 $V_{RMS}$ and about 50 $V_{RMS}$. Thus, the RF voltage on the electrostatic shield and thereby the RF plasma potential can be adjusted to be in a reasonably wide range for a step specified by recipe in a desired plasma process.

According to example aspects of the present disclosure, in some embodiments, by having in addition a second tunable reactive impedance circuit that in some embodiments contains both an inductor and a variable capacitor connecting the inductive coupling element to the electrostatic shield, the range of RF voltage on the electrostatic shield can be further increased substantially compared with the RF voltage range for the electrostatic shield having no second adjustable reactive circuit. For instance, in some embodiments, the second reactive impedance circuit can increase the RF voltage of the electrostatic shield (e.g., a maximum shield RF voltage achieved by the first reactive circuit alone) by tuning the variable capacitor in that circuit so that the capacitive reactance dominates the inductive reactance of the inductor in that circuit. The resulting net capacitive reactance of the second reactive impedance circuit in parallel with the air-gap capacitive coupling $C_A$ can increase the RF current flow from the inductive coupling element to the electrostatic shield. The increased RF current in phase with the current through the air-gap capacitance $C_A$ can increase the net total RF current flow from the inductive coupling element to the electrostatic shield and the RF voltage on the electrostatic shield. In some embodiments, the RF current flow to the electrostatic shield can be increased (e.g., maximized) even more by tuning the capacitor in the second adjustable reactive circuit to series resonance with the inductor to provide substantially increased total RF current flow from the inductive coupling element to the electrostatic shield. In some embodiments, RF current flow to the shield can be increased by tuning the capacitor in the second reactive impedance circuit to have a greater than or equal capacitive reactance to the inductive reactance of the inductor in the second reactive impedance circuit. As such, the RF voltage on the electrostatic shield can be increased easily to greater than about 100 $V_{RMS}$ and even to about 200 $V_{RMS}$ which enables RF plasma potential to exceed about 50 $V_{RMS}$ and even to reach about 100 $V_{RMS}$.

In some embodiments, the second tunable reactive impedance circuit can significantly reduce the shield RF voltage. For instance, the first tunable reactive impedance circuit connecting the electrostatic shield to ground can be tuned to have very low net reactance while the second tunable reactive impedance circuit can be tuned to be a parallel resonance condition with the air-gap capacitance between the electrostatic shield and the inductive coupling element. Such parallel resonance of the second circuit can result in substantial cancellation of the RF (displacement) current flow from the inductive coupling element to the electrostatic shield, thereby reducing the electrostatic shield RF voltage to about 1 $V_{RMS}$ or less. Therefore, the second tunable reactive impedance circuit having such range of impedance and independent of the first reactive circuit can increase the range of shield RF voltage that can be achieved and therefore the flexibility and capability of the processing chamber.

In some embodiments, without the first tunable reactive impedance circuit, the second tunable reactive impedance circuit alone can be used to increase or decrease the shield RF voltage range. For instance, in some embodiments, the second reactive impedance circuit can increase the shield RF voltage by tuning the variable capacitor in that circuit so that the capacitive reactance dominates the inductive reactance of the inductor in that circuit. In some embodiments, the RF current flow to the electrostatic shield can be further increased by tuning the capacitor in the second adjustable reactive circuit to series resonance with the inductor to provide substantially increased total RF current flow from the inductive coupling element to the electrostatic shield. In some embodiments, the second tunable reactive impedance circuit can be tuned to be parallel resonance with the air-gap capacitance between the electrostatic shield and the inductive coupling element to substantially reduce the net RF current to the shield and therefor the shield RF voltages.

In some embodiments, the plasma can extend to a volume adjacent a workpiece supporting pedestal for a range of the first tunable reactive impedance circuit and/or second tunable reactive impedance circuit conditions where the RF plasma potential is sufficiently large. When the workpiece supporting pedestal is comprised of conducting material and has low electrical impedance to ground (e.g., less than about 10 Ohms) over some range of settings of the tunable impedance from the electrostatic shield to ground, there can be a space-charge sheath having an RF voltage amplitude exceeding about 10 Volts between the plasma and the workpiece supporting pedestal such that ions from the plasma above the pedestal can be accelerated by the electric field in the sheath to bombard the workpiece supported upon the pedestal. When the RF plasma potential is greater than about 50 Volts amplitude (e.g., about 35 $V_{RMS}$) the ions can have large energies (e.g., maximum energies) greater than about 20 electron Volts (eV) or more, such that the ions can participate in accelerating or controlling the etching or PEVCD process on the workpiece. In some embodiments, the plasma potential above the pedestal can be a function of the ratio of the surface area of the electrostatic shield to the surface area of the pedestal and surrounding metal chamber walls. By restricting the plasma volume to a small plasma volume (e.g., a minimum plasma volume needed to cover the workpiece), the ratio of shield surface area to grounded wall area can be greater than about 1, and the sheath potential above the workpiece can be greater than the sheath potential at the dielectric wall inside the electrostatic shield. This can be helpful in reducing wall sputtering from the dielectric and increasing the ion energy bombarding the workpiece (e.g., a substrate or a wafer).

One example aspect of the present disclosure is directed to a plasma processing apparatus. The plasma processing apparatus can include a plasma chamber, a dielectric window or wall forming at least a portion of the plasma chamber, an inductive coupling element located proximate the dielectric window, an electrostatic shield interposed between the dielectric wall and the inductive coupling element and the electrostatic shield connected to ground through a first tunable reactive impedance circuit having tunable impedance, a second tunable reactive impedance circuit connecting the electrostatic shield to the inductive coupling element, a voltage sensor to measure an RF voltage of the electrostatic shield, and a controller configured to adjust the RF voltage of the electrostatic shield by adjusting the reactive impedance of the first tunable reactive impedance circuit and second tunable reactive impedance circuit. Because of significant air-gap or free space capacitance between the electrostatic shield and the workpiece processing chamber and air-gap or free-space stray capacitance between the electrostatic shield and an enclosure for the plasma chamber, having total capacitance of $C_S$, the first tunable reactive impedance circuit that connects the electrostatic shield to ground can combine in parallel with the combined free-space capacitance of the electrostatic shield to ground giving a wide range of net reactive impedances between the electrostatic shield and ground. A reactance range of the first reactive circuit in some embodiments can include both parallel resonance with $C_S$ and series resonance of capacitor and inductor within the first tunable reactive impedance circuit. Such reactance range of the first reactive circuit can result in a much wider tunable range of RF voltage on the electrostatic shield. A reactance range of the second reactive circuit in some embodiments can include both parallel resonance with $C_A$ and series resonance of capacitor and inductor within the second tunable reactive impedance circuit. Such reactance range of the second reactive circuit can result in a wider tuning range for the total impedance between inductive coupling element and the electrostatic shield.

In some embodiments, the in-air or free-space stray capacitance of the electrostatic shield to electrical ground, $C_S$, which does not include any circuit connecting the electrostatic shield to ground, can be between about 20 picofarads and about 2000 picofarads. In some embodiments, the range of $C_S$ can be from about 50 pf to about 1000 pf. In some embodiments, the first tunable reactive impedance circuit connected from the electrostatic shield to ground can be a circuit in parallel with the stray capacitance, $C_S$. In some embodiments, the first tunable reactive impedance circuit can include a series combination of inductor, $L_1$, and variable capacitor, $C_1$. Inductance range of the inductor, $L_1$, and capacitance range of the capacitor, $C_1$, can be chosen to enable both series resonance of $L_1$ with $C_1$ as well as parallel resonance of combined components, $L_1+C_1$, with the stray capacitance $C_S$ of the electrostatic shield to electrical ground. The magnitude of reactance of the inductor $L_1$ can be greater than the magnitude of reactance of (free-space plus through any dielectric insulation) the stray capacitance between the electrostatic shield and ground, $C_S$. The variable capacitor $C_1$ can have a first reactance magnitude (e.g., a maximum reactance magnitude) slightly (e.g., greater than about 10%) more than the magnitude of inductive reactance of $L_1$, and a second reactance magnitude (e.g., a minimum reactance magnitude) sufficiently small such that the second reactance magnitude can yield a net inductive reactance of the first circuit slightly larger than the magnitude of reactance of the free-space capacitance between the electrostatic shield and a ground reference ($|Xc|=1/[\omega\ C_S]$), when the second reactance magnitude is subtracted from the reactance of $L_1$. This latter condition of parallel resonance can permit partial or complete cancellation of the RF current through $C_S$ from the electrostatic shield to ground thereby increasing the electrostatic shield RF voltage and the RF voltage range to which the electrostatic shield can be tuned. In some embodiments, the variable capacitor in the first reactive impedance circuit between the electrostatic shield and ground can be a simple two-position capacitor where one position is low impedance of the first reactive circuit and the other position is near parallel resonance with $C_S$ yielding a high total impedance of shield to ground so that the tuning of the electrostatic shield RF voltage at a given power level can be more economically accomplished. According to example aspects of the present disclosure, the inductive coupling element of the plasma processing apparatus can generate a plasma in the plasma chamber when energized with RF energy. The RF plasma potential can be controlled at a plurality of levels. Such plasma processing apparatus and associated methods can be very useful for different applications.

In some embodiments, the in-air or free-space stray capacitance ($C_A$) of the inductive coupling element to the electrostatic shield can be between about 5 picofarads and about 1000 picofarads. In some embodiments, the range of $C_A$ can be from about 20 pf to about 500 pf. In some embodiments, the second tunable reactive impedance circuit from the electrostatic shield to the inductive coupling element can include an inductor and a variable capacitor connected in series. Inductance of the inductor, $L_2$, and capacitance range of the capacitor, $C_2$, can be chosen to enable both series resonance of $L_2$ with $C_2$ as well as parallel resonance of combined components with a stray capacitance $C_A$ of the electrostatic shield to the inductive coupling element. The magnitude of reactance of the inductor $L_2$ can be between one and two times the magnitude of reactance of (free-space plus through any dielectric insulation) capacitance $C_A$ between the electrostatic shield and the inductive coupling element. The variable capacitor can have a first reactance magnitude (e.g., a maximum reactance magnitude) slightly more than the magnitude of inductive reactance of $L_2$. The variable capacitor can have a second reactance magnitude (e.g., a minimum reactance magnitude) sufficiently small that when subtracted from the reactance of $L_2$ it yields a net reactance slightly larger than the magnitude of reactance of the free-space capacitance between the electrostatic shield and coil ($|Xc|=1/[\omega\ C_A]$). As such, a parallel resonance condition can be achieved for the second reactive circuit that permits effective cancellation of the RF current flowing to the electrostatic shield from the inductive coupling element, thereby reducing the RF current shunted to the electrostatic shield and reducing the lower limit of the RF voltage range to which the electrostatic shield can be tuned. In some embodiments, the variable capacitor in the second reactive impedance circuit between the electrostatic shield and the inductive coupling element can be incorporated into the impedance matching network housing, as well as grounding for the first reactive circuit coming from the electrostatic shield, so that the tuning of the electrostatic shield RF voltage at a given power level can be more economically accomplished. According to example aspects of the present disclosure, the inductive coupling element of the plasma processing apparatus can generate a plasma in the plasma chamber when energized with RF energy. The RF plasma potential can be controlled at a wide range of levels that may be useful for any step of a process or processes.

In some embodiments, the inductive coupling element (e.g. the antenna or coil for an inductive coupled plasma source) can be powered by an automatically controllable source of RF electric power that provides RF electric current to flow through the inductive coupling element. A workpiece-supporting pedestal can be located within an exhausted chamber, and/or within and/or proximate a plasma generated by the inductive coupling element. The dielectric window can be a dielectric wall forming at least a portion of the plasma chamber. The electrostatic shield can be a slotted electrostatic shield interposed between the inductive coupling element and the dielectric wall. The electrostatic shield can be connected to an electrical ground through a tunable, substantially reactive first reactive impedance circuit. In some embodiments, the electrostatic shield can have a plurality of plates of electrically conducting material(s) that are collectively grounded through a first automatically adjustable reactive impedance circuit and such plates can be separated each from the others by gaps that are between about 2 millimeters (mm) and about 3 (centimeters) in width. Such gaps can have a long direction approximately perpendicular to a direction of current flow in the inductive coupling element. The configuration of plates and gaps can be such that the direct electrostatic coupling (capacitance) between the inductive coupling element and the inner surface of the dielectric wall can be reduced by about a factor of at least about two or more.

In some embodiments, the electrostatic shield can be connected to a conducting top cover of the plasma chamber such that the conducting top cover can conduct RF current to/from the plasma generated by the inductive coupling element directly or through a thin dielectric liner that may be adjacent the inner surface of the top cover. The conducting top cover in some embodiments can be positioned adjacent a top portion of the dielectric wall. In some embodiments, the controller can adjust the RF voltage of the electrostatic shield, and thereby the voltage of the top cover, within a range from less than about 5 V amplitude to about 500 V amplitude by adjusting both a total impedance from the electrostatic shield to ground—including the stray capacitance $C_S+C_{T-G}$ (because $C_S$ and $C_{T-G}$ combined are the parallel capacitances to ground from the shield and top cap) in parallel with the first tunable reactive impedance circuit—from about 1 Ohm to about 100 Ohms or more, and the total impedance from the inductive coupling element to the electrostatic shield—including both the stray capacitance $C_A$ and second tunable reactive impedance circuit—from less than about 50 Ohms to more than about 200 Ohms.

In some embodiments, the controller can include a circuit (e.g., connected to a voltage sensor or detector) to measure an RF voltage at a location close to the inductive coupling element on one or more shield plates or the shell that forms the electrostatic shield. The circuit can provide data indicative of this measured RF voltage to the controller to enable the controller to adjust the reactive impedance of the first circuit between the electrostatic shield and ground as a part of a closed loop control system. In some embodiments, the controller can adjust the impedance of the second variable-reactance circuit that connects the inductive coupling element to the electrostatic shield as part of a closed-loop control system. In some embodiments, the controller can adjust reactive impedances of both first and second reactive impedance circuits to adjust the RF voltage on the electrostatic shield for a particular process step to provide desired level of ion bombardment for that process step. In some embodiments, the controller can adjust impedances of both first and second reactive circuits so that the RF voltage on the electrostatic shield can be reduced (e.g., minimized) so that there is a reduced (e.g., minimal) ion bombardment of the workpiece in accordance with a specific process step. In some embodiments, the controller can adjust an impedance between the electrostatic shield and the inductive coupling element in parallel with adjusting an impedance between the electrostatic shield and ground so that accurate and repeatable control of the RF voltage on the electrostatic shield can be achieved.

According to example aspect of the present disclosure, the plasma processing apparatus can include a processing chamber to process the workpiece and baffle structure (e.g., a separation baffle) separating (e.g., partially separating, also referred to as a separation baffle) the processing chamber from the plasma chamber. For instance, the separation baffle can be interposed between the plasma chamber and the workpiece support pedestal in the processing chamber. The separation baffle can block one or more portions of a flow path for the plasma and gas from the region of plasma generation to the workpiece to partially absorb or divert charged particles from a gas stream flowing down from the plasma chamber to the workpiece.

In some embodiments, the separation baffle can have no holes so that gas does not flow through the separation baffle, e.g., a disk with no holes. In some embodiments, the separation baffle can have a disc shape and cover area symmetrically about a center axis of a cylindrical plasma source volume such that a center of the separation baffle is located above an approximate center of the workpiece support. In some embodiments, the separation baffle can have a diameter that is between about 0.7 of the diameter of the chamber at that position and as little as about 0.10 of the diameter of the chamber. For instance, the separation baffle can cover only a fraction (e.g., less than about 50%, such as less than about 25%) of the flow area from inductive coupling element to the workpiece. In some embodiments, the separation baffle can be round and symmetrical with its center located above a center of the workpiece such that the plasma can diffuse or flow around the separation baffle with the gas down to the workpiece. The separation baffle can be made of an electrical insulating material or an electrical conducting material. In some embodiments, the separation baffle can be between about 5 cm from the workpiece and about 20 cm from the workpiece.

In some embodiments, the separation baffle can have multiple holes that allow some gas to flow through the separation baffle. For instance, the separation baffle can be a small grid with multiple small holes. A hole diameter can be of the same order or the same size as thickness of the separation baffle such that most ions which enter that hole cannot penetrate through the separation baffle. In some embodiments, the separation baffle can be made of conducting material, such as metal, silicon, carbon or other materials with some measure of electrical conduction.

In some embodiments, the separation baffle can be electrically biased by an external power supply. This bias voltage can be controllable by a controller for the processing chamber. The bias voltage can be varied from process to process or step to step within a process for a single workpiece or a plurality of workpieces. In this case, a wire or conducting strut or support can be used to provide electric current to the separation baffle from the external power supply.

In some embodiments, the separation baffle can cause the plasma to have a uniform density profile above the workpiece such that processing for the workpiece can be uniform. Such separation baffle can be made of electrical insulator material or conducting material. The separation baffle that is made of conducting material can be grounded electrically or floating electrically. In some embodiments, such separation baffle may not be electrically biased to cause enhanced ion collection, or to receive ion bombardment, or cause the potential of the plasma to be elevated.

In some embodiments, the plasma processing apparatus can include a complete separation baffle (e.g., a separation grid) when performing an isotropic etching process, such that all gas from the chamber wherein a plasma energized by an inductive coupling element flows through the separation baffle to reach the workpiece. The separation baffle can partially or nearly completely absorb charged particles from the gas stream flowing down from the plasma chamber to the workpiece to reduce electrical charging of the workpiece and potential ion damage to the workpiece. When charged particles are needed for the process, the RF plasma potential of the inductive coupling element can be increased to a point where hollow anode discharges are ignited in the holes of the separation baffle such that ionization occurs in the holes in the separation baffle thereby producing separately a plasma in the gas volume adjacent the separation baffle and proximate the workpiece.

In some embodiments, the workpiece supporting pedestal of the processing chamber can be of conducting material and can be electrically grounded such that either or both DC and RF impedances to ground of the pedestal are less than or about 5 Ohms. The plasma generated by the inductive coupling element under some conditions, usually when there are larger values of RF voltage on the electrostatic shield, can extend to the volume above the workpiece supporting pedestal that is made of conducting material. Thus, over some range of settings of the tunable reactive impedance circuit from the electrostatic shield to ground, the plasma processing apparatus can include a space-charge sheath between the plasma and the workpiece or workpiece supporting pedestal such that ions from the plasma above the pedestal can be accelerated by electric field in the space-charge sheath to bombard the workpiece supported upon the pedestal.

In some embodiments, the one or more metal or conducting walls of the processing chamber can be electrically grounded. In some embodiments, a parameter for the area ratio referred to as $R_A$ can be defined which equals the ratio of the surface area of the processing chamber walls between the plasma chamber and dielectric plasma barriers combined with area of the workpiece supporting pedestal divided by the area of the electrostatic shield, and when the shield is connected to the top cover for the plasma chamber to the summed areas of shield and top cover. When $R_A$ is less than about 3 and at the same time there is some RF voltage on the shield, this can be beneficial to a process in increasing a sheath potential at a workpiece surface and decreasing a sheath potential at interior walls of the dielectric wall or the top cap. This can reduce ion sputtering from the dielectric walls of the plasma source and can increase ion energy bombarding the workpiece. Suitable for such low source wall sputtering condition can be a condition where the area of the dielectric walls of the plasma chamber (combined with that of the top cap if it is connected to the shield) is greater than the grounded wall area of the source including the workpiece supporting pedestal (e.g., $R_A$ is less than about 1). For any given RF voltage on the electrostatic shield, increasing electrostatic shield and/or cap areas relative to the grounded wall area will generally cause the sheath potential above the workpiece to increase, thereby further increasing the energy of ions incident on the workpiece and decreasing the ion energy incident on interior walls of the plasma source. In some embodiments, the plasma chamber can be a part of the processing chamber wherein the wall adjacent the inductive coupling element is a dielectric material. For instance, in some embodiments, the plasma chamber can include a top cover having a part that is dielectric wall, an inductive coupling element proximate that part of the top cover and an electrostatic shield (e.g., a Faraday shield) between the inductive coupling element and the dielectric wall, and a workpiece supporting pedestal that has a low RF impedance to ground. Plasma chamber metal walls around the workpiece supporting pedestal can be electrically grounded. In some embodiments, the area of the pedestal combined with the metal walls around the workpiece supporting pedestal can be less than or approximately equal to the area of the Faraday shield adjacent the dielectric wall (e.g., $R_A$ is less than about 3). In this case, the ratio of grounded area to shielded area can be less than about 3, or, in some embodiments less than about 1.

In some embodiments, at a fixed value of the RF power, the controller can adjust values of the second reactive RF impedance between the electrostatic shield and the inductive coupling element in addition to adjusting the impedance of the first reactive circuit between the electrostatic shield and ground to permit tuning of the amplitude of the RF potential on the electrostatic shield between less than about 5 Volts and about 500 Volts, thereby causing the RF amplitude of the plasma potential to be in a range between less than about 2 $V_{RMS}$ to as great as about 300 $V_{RMS}$.

In some embodiments, the plasma processing apparatus can include a baffle structure having one or more dielectric elements (e.g., one or more dielectric partitions, or barriers, or baffles, or dielectric grids, or dielectric walls) in some areas near the workpiece supporting pedestal. The one or more dielectric elements can restrict the plasma to prevent the plasma from filling some of the volume of the processing chamber below the workpiece down to and including the vacuum pumping line. In this manner, the area of the grounded chamber walls adjacent the plasma combined with the area of the pedestal can be limited to be less than 5 times as large as the combined areas of the electrostatic shield, and in some embodiments including the top cap of the plasma chamber, and in some embodiments less than the combined areas of shield and cap.

In some embodiments, the electrostatic shield can be separated by a distance that is less than about 1 centimeter from the dielectric wall of the plasma chamber. In some embodiments, the distance between the electrostatic shield and the dielectric wall can be less than about 5 millimeters (mm). In some embodiments the gap from the electrostatic shield to the dielectric wall can be less than about 2 mm. A smaller gap generally increases capacitance between the electrostatic shield and the plasma and increases the RF current flow to the plasma from the shield. For instance, the capacitance can be increased to be at least about 50 picofarads for a plasma source with the electrostatic shield diameter greater than about 200 mm. Through such capacitance RF currents can flow from the electrostatic shield, through the dielectric wall to the plasma when the inductive coupling element conducts an RF current. For RF currents that are typically greater than an Ampere this causes the inductive coupling element to have a substantial RF voltage due to its inductance which may be of order one micro-Henry or more. In general, the smaller the gap from the electrostatic shield to the dielectric wall, the greater the capacitance—thereby increasing the RF plasma potential.

Another example aspect of the present disclosure is directed to a method for processing a workpiece. The method can include admitting a process gas into an exhausted plasma chamber; generating, by an inductive coupling element, a plasma from the process gas in the plasma chamber; adjusting a RF voltage of an electrostatic shield located between the inductive coupling element and the plasma chamber by adjusting a first tunable reactive impedance coupled between the electrostatic shield and a ground reference; and further adjusting a voltage of an electrostatic shield located between the inductive coupling element and the plasma chamber by adjusting a second tunable reactive circuit connected between the electrostatic shield and the inductive coupling element; and conducting a step in an etch process on the workpiece.

In some embodiments, an exhaust pump can remove spent process gas from the plasma chamber. One or more process gases can flow into the plasma chamber by one or more mass flow controllers at one or more flow rates that can be automatically controlled to appropriate values independently during different steps of the etch process. Gas pressure in the plasma chamber can be controlled by an automated controller for the etch process. Gas pressure can be controlled in the range between about 1 mTorr (e.g., about 0.13 Pascals) and about 10 Torr (e.g., about 660 Pascals). Examples of the process gases can include oxygen ($O_2$), hydrogen (H$_2$), nitrogen (N$_2$), argon (Ar), helium (He), carbon monoxide (CO), carbon dioxide (CO$_2$), ammonia (NH$_3$), methane (CH$_4$), water vapor (H$_2$O), chlorine (Cl$_2$), boron tribromide (BBr$_3$), boron trichloride (BCl$_3$), and one or more fluorinated gases including tetrafluoromethane (CF$_4$), nitrogen trifluoride (NF$_3$), sulfur hexafluoride (SF$_6$), hydrogen fluoride (HF), fluorine (F$_2$) and other gases.

In some embodiments, the controller can pre-set the first tunable reactive impedance from the electrostatic shield to ground such that the magnitude of the tunable reactive impedance can be at least about 10 Ohms and the total impedance from the electrostatic shield to ground at least about 5 Ohms. RF power can be turned on to provide RF current to the inductive coupling element (e.g., induction coil) such that the voltage of the electrostatic shield can be greater than about 10 V$_{RMS}$. The plasma can then be ignited by an RF electric field proximate the interior surface of a dielectric wall adjacent the electrostatic shield. The dielectric wall (also referred to as a dielectric window) can form at least a portion of the plasma chamber enclosure. When the RF power is turned on, one or more voltage sensors can measure the voltage of the electrostatic shield and can provide a measured voltage of the electrostatic shield to the controller. The controller can tune first and second reactive impedances that cause the shield voltage to be appropriate for the first step of the etch process (e.g., plasma ignition).

In some embodiments, the etch process can include an isotropic etching step having an RF plasma potential less than 3 V amplitude (e.g., about 2 V$_{RMS}$). During this step, the controller can set the first tunable reactive impedance between the electrostatic shield and ground to a very low value (e.g., less than about 2 Ohms, or less than about 1 Ohm), which may be achieved by tuning at or near series resonance between L$_1$ and C$_1$. Then, the controller can independently set the second tunable reactive circuit from the inductive coupling element to the electrostatic shield to near parallel resonance with C$_A$, decreasing the total reactive impedance from the inductive coupling element to the electrostatic shield to reduce the RF voltage on the electrostatic shield such that the RF voltage can be less that about 10 V amplitude (7 V$_{RMS}$) so that the energy of ion bombardment is sufficiently low (e.g., less than about 2 eV) that ion scattering in the gas produces a virtually isotropic ion distribution.

In some embodiments, the etch process can include an ion-assisted etching step that has a substantial ion bombardment assistance. During this step, in some embodiments, the controller can set the first tunable reactive circuit—L$_1$ and C$_1$ in series—so this circuit in parallel with C$_S$ is at or near parallel resonance with C$_S$—so that the impedance from the electrostatic shield to ground is more than about 100 Ohms. The second tunable reactive circuit can also be tuned so that the reactance of the second tunable reactive circuit from the inductive coupling element to the electrostatic shield can be capacitive and less than or about equal to the capacitive reactance of the air-gap capacitance (C$_A$) from the inductive coupling element to the electrostatic shield. Such capacitive reactance of the second tunable reactive circuit can increase the RF current from the inductive coupling element to the electrostatic shield by at least about 50% increasing the RF voltage of the electrostatic shield to at least about 30 V$_{RMS}$ or more and preferably 100 V$_{RMS}$ so that the plasma potential can be at least about 10 V$_{RMS}$ and preferably greater than about 30 V$_{RMS}$. This step of the etching process can then proceed until either time is used up or an endpoint signal from the plasma or diagnostic causes the step to terminate.

In some embodiments, the plasma processing apparatus can perform an etching step that can be a first step in a multi-step process wherein ion bombardment is an important mechanism for activation of the etching. In some embodiments, for this etching step, the first reactive impedance circuit between the electrostatic shield and ground, and the second tunable reactive circuit between the inductive coupling element and the electrostatic shield can both be tuned independently by an automatic control system according to the above method so that the RF potential on the electrostatic shield can be greater than about 50 Volts RMS and the RF plasma potential can be greater than about 20 Volts RMS. This can then provide for ion bombardment of the workpiece with sufficient energy to activate reactive ion etching (RIE) reactions on the workpiece surface.

In some embodiments, once the first step of the etch process has been completed, the gas flows and RF power can be changed to desired settings for a second step of the etch process that can be an isotropic etching step where the ion bombardment is greatly reduced for this step. The controller can re-tune the reactive impedance for a second or later step such that a measured RF voltage of the electrostatic shield is much smaller than that used for the first step. For instance, as described above, the RF Voltage of the electrostatic shield can be less than about 10 V$_{RMS}$ when that step is an isotropic etching step.

As another example, the controller can adjust the RF voltage of the electrostatic shield to be a value different from that of the first step, e.g., more than about 100 V$_{RMS}$. As such, the first tunable reactive circuit from the electrostatic shield to ground and the second tunable reactive circuit from the inductive coupling element to the electrostatic shield can be set such that the RF voltage of the electrostatic shield can have a value appropriate for the need for ion bombardment. Such value for the voltage of the electrostatic shield as desired for the process can come from a recipe for the second step. The controller can compare the measured value with a desired voltage of the electrostatic shield to adjust the first and second tunable reactive circuits until the measured value is equal to the desired voltage (e.g., a set point). The use of both first and second tunable reactive circuits independently can enable the wide range of shield voltages for such flexibility of processing. The desired voltage can be preprogrammed, such as in a process "recipe", and/or can be manually input by an operator.

Aspects of the present disclosure are discussed with reference to two steps of the etch process for purposes of illustration and discussion. Those of ordinary skill in the art, using the disclosures provided herein, will understand that the etch process can include two or more process steps and various control parameters (e.g., values associated with the reactive impedance, voltages of the electrostatic shield) for each step of the etch process such that the various control parameters can be adjusted at the beginning of the step and maintained at the desired values throughout the process step.

Another example aspect of the present disclosure is directed to a plasma processing apparatus. The plasma processing apparatus can include a plasma chamber, a dielectric wall forming at least a portion of the plasma chamber, an inductive coupling element (inductive coupling element) located proximate the dielectric wall, an electrostatic shield located between the inductive coupling element and the dielectric wall, a first tunable reactive circuit having at least a variable capacitor connecting the electrostatic shield to ground, a second tunable reactive circuit having at least a variable capacitor connecting the electrostatic shield to the inductive coupling element. The inductive coupling element can generate a plasma in the plasma chamber when energized with radio frequency (RF) energy. The function of the combined first and second tunable reactive circuits can be to adjust the RF voltage on the electrostatic shield over a wider range. Total impedances from the inductive coupling element to the electrostatic shield and from the electrostatic shield to ground include $C_A$ and $C_S$ such that parallel combinations of the first and second tunable circuits and stray capacitances in parallel can allow a wide range (e.g., a maximum range) for each total impedance. Such combination can make these impedances independently tunable such that the shield RF voltage can be adjusted to appropriate values.

In some embodiments, the first tunable reactive circuit connected from the electrostatic shield to electrical ground can be a circuit having a combination of at least one inductor(s) and at least one capacitor(s), where any of the components can be adjustable or tunable within a range of reactance. In some embodiments, the first tunable reactive circuit between the electrostatic shield and ground can include at least a series combination of an inductor $L_1$ that has a magnitude of reactance greater than the magnitude of reactance of the capacitance ($C_S$). The inductor $L_1$ can be fixed or tunable over some part of said range. That is: $\omega L_1 > (1/(\omega\ C_S))$, where $\omega$ is an angular frequency of a principal RF power Fourier component provided to the inductive coupling element. Further, the capacitor of this circuit can be fixed or variable, but is preferably variable with a capacitance range from a first lower limit capacitance value to a second upper limit capacitance value. For instance, the lower limit capacitance value can have a a magnitude of reactance greater than a magnitude of reactance of the inductor $L_1$: $[1/(\omega\ C_{1,min}))] > (\omega L_1)$. The upper limit capacitance can have a magnitude $[1/(\omega\ C_{1,max}))]$ that when subtracted from the inductive reactance of the inductor $L_1$, yields a total reactance of the combination $L_1$ and $C_1$ that is inductive and greater than or equal to the magnitude of the reactance of the free-space or air-gap capacitance, $[1/(\omega\ C_S)]$. The first tunable reactive circuit then can be tuned by an automatic control system that tunes the capacitor $C_1$ or the inductor $L_1$ or both so that the inductor $L_1$ and the capacitor $C_1$ can be put into approximate series resonance, in which case the impedance between the electrostatic shield and ground can be less than about 10 Ohms. Also, the capacitance of the capacitor $C_1$ can be tuned so that the stray capacitance, $C_S$, and first reactive circuit are at or near parallel resonance resulting in a large total impedance (e.g., greater than about 100 Ohm) between the electrostatic shield and ground. In this latter case, there can be a reduced net RF current flow to ground, resulting in higher voltage of the electrostatic shield relative to the case without the first tunable reactive circuit. In some embodiments, the first tunable reactive circuit connecting the electrostatic shield to ground can connect to one or more locations on the electrostatic shield closest to a center of the inductive coupling element or can connect to any point on the electrostatic shield. In some embodiments, the first tunable circuit can connect to an end of the electrostatic shield, the inductance $L_1$ for sake of calculating the resonance conditions can include the inductance from the center of the electrostatic shield to the point at which it is connected to the first tunable circuit.

In some embodiments, the second tunable reactive circuit connected from the inductive coupling element to the electrostatic shield can be a circuit having a combination of at least one inductor(s) and at least one capacitor(s), where any of the components may be adjustable or tunable within a range of reactance. In some embodiments, the second tunable circuit can include at least a series combination of an inductor $L_2$ and capacitor $C_2$. The inductor $L_2$ can have a magnitude of reactance greater than the magnitude of reactance of the air-gap (free-space) capacitance ($C_A$). The inductor $L_2$ can be fixed or tunable over some part of said range. That is: $\omega L > (1/(\omega\ C_A))$, where $\omega$ is an angular frequency of a principal RF power Fourier component provided to the inductive coupling element. Further, the capacitor $C_2$ connecting the inductive coupling element and the electrostatic shield can be fixed or variable. The capacitor $C_2$ can have a capacitance range from a first capacitance that is a lower limit for $C_2$ to a second capacitance that is an upper limit for $C_2$. The first capacitance, $C_{2,min}$, should have a magnitude of reactance greater than the magnitude of the reactance of the inductor $L_2$: $[1/(\omega\ C_{2,min}))] > (\omega L_2)$. The second capacitance (upper limit) of $C_2$ can have a reactance, $[1/(\omega\ C_{2,max}))]$ of such magnitude that when this reactance is subtracted from the inductive reactance of the inductor $L_2$, which is $\omega\ L_2$, it results in a total reactance of the series combination $L_2$ and $C_2$ that is net inductive and greater than the magnitude of the reactance of the free-space or air-gap capacitance, $[1/(\omega\ C_A)]$. The second tunable reactive circuit then can be tuned by the automatic control system that tunes the capacitor $C_2$ or the inductor $L_2$ or both so that the inductor $L_2$ and the capacitor $C_2$ can be put into in series resonance, in which case the impedance between the inductive coupling element and the electrostatic shield is less than about 10 Ohms. Also, the capacitance of the capacitor $C_2$ can be tuned so that the combination of air-gap capacitance $C_A$ and second reactive circuit are in parallel resonance resulting in a large total impedance (e.g., greater than about 100 Ohm) between the electrostatic shield and the inductive coupling element. In this latter case, there can be a reduced net RF current flow between the inductive coupling element and the electrostatic shield relative to the case without the second tunable circuit resulting in a smaller induced RF potential on the electrostatic shield induced by capacitive coupling from the inductive coupling element. In some embodiments, the second tunable reactive circuit can connect one or more locations on the inductive coupling element near the center of the inductive coupling element to the electrostatic shield or can connect any point on the inductive coupling element to the electrostatic shield. In some embodiments, the second tunable circuit can connect an end of the inductive coupling element to the electrostatic shield. The inductance $L_2$ for sake of calculating the resonance conditions can include the inductance from the center of the inductive coupling element to the point at which it is connected.

In one of the cases mentioned above, a low impedance near or at series resonance can be tuned for the second reactive circuit connecting the electrostatic shield to the inductive coupling element giving an increased RF voltage on the electrostatic shield. In some embodiments, the first tunable reactive circuit connecting the electrostatic shield and ground can further increase the RF voltage on the electrostatic shield by tuning the variable capacitor in the first tunable reactive circuit to make the first reactive circuit have a total reactance that is inductive so that in parallel combination with the stray capacitance it increases the total impedance from the electrostatic shield to ground. In this event, the RF voltage on the electrostatic shield can be increased (e.g., maximized) and the ion bombarding energy onto the workpiece or substrate can be increased (e.g., maximized) for a given level of RF power input to the inductive coupling element.

For a case where very low shield voltage is desired, the second tunable circuit can be tuned for parallel resonance of the second reactive circuit with the air-gap capacitance, $C_A$, and at the same time providing further reduction of RF voltage on the electrostatic shield by tuning the reactance of the first tunable circuit to a condition of series resonance of the capacitor $C_1$ and the inductor $L_1$. This can reduce (e.g., minimize) the value of RF voltage on the electrostatic shield to a value approaching or less than 1 $V_{RMS}$ so the value of the RF plasma potential can give a very low (e.g., less than about 2 eV) energy of ion bombardment of the workpiece from the plasma which will avoid anisotropic etching.

In some embodiments, the "air-gap" capacitance ($C_A$) of the inductive coupling element to the electrostatic shield, which is the free space capacitance between the two when they have no circuit connection, can be between about 5 picofarads and about 500 picofarads and in some embodiments the capacitance, $C_A$, can be between about 10 picofarads and about 200 picofarads. In some embodiments, the plasma processing apparatus can further include a voltage sensor configured to measure a voltage of the electrostatic shield. In some embodiments, the second tunable reactive circuit connecting the electrostatic shield to the inductive coupling element can be tuned to vary the total impedance between the inductive coupling element and the electrostatic shield from series resonance of the circuit having a very small impedance value (e.g., less than about 1 Ohm) to parallel resonance of the second circuit with the air-gap capacitance $C_A$, giving a very large impedance value (e.g., greater than about 100 Ohms). The plasma processing apparatus can further include a controller to adjust, automatically or manually, the voltage of the electrostatic shield by adjusting the first tunable reactive impedance circuit (e.g., the variable capacitor $C_1$) between the electrostatic shield and ground based on a measured voltage of the electrostatic shield. In some embodiments, the controller can further adjust (increase a previous maximum RF voltage or decrease a previous minimum RF voltage) the voltage of the electrostatic shield by adjusting the second tunable reactive circuit (e.g., the variable capacitor $C_2$) connecting the electrostatic shield with the inductive coupling element.

Aspects of the present disclosure are discussed with reference to a "workpiece," "substrate," or "wafer" for purposes of illustration and discussion. Those of ordinary skill in the art, using the disclosures provided herein, will understand that the example aspects of the present disclosure can be used in association with any semiconductor wafer or substrate or other suitable substrate or workpiece. A "pedestal" is any structure that can be used to support a workpiece. In addition, the use of the term "about" or "approximately" in conjunction with a numerical value is intended to refer to within 10% of the stated numerical value.

As used herein, a parallel resonance condition with a stray capacitance between the electrostatic shield and a ground reference occurs when a net inductive reactance of a tunable reactive impedance circuit is approximately equal to the magnitude of reactance of the stray capacitance at the frequency of RF energy applied to the inductive coupling element. In some embodiments, a parallel resonance condition can occur and/or can be detected when a voltage on the electrostatic shield is within 10% of a relative maximum. A parallel resonance condition with a stray capacitance between the electrostatic shield and an inductive coupling element reference occurs when a net inductive reactance of a tunable reactive impedance circuit is approximately equal to the magnitude of reactance of the stray capacitance at the frequency of RF energy applied to the inductive coupling element. In some embodiments, a parallel resonance condition can occur and/or can be detected when a voltage on the electrostatic shield is within 10% of a relative minimum. A series resonance condition of a tunable reactive impedance circuit occurs when a net reactance of an inductor of the tunable reactive impedance circuit is approximately equal to a reactance of a capacitor of the tunable reactive impedance circuit at the frequency of RF energy applied to the inductive coupling element. In some embodiments, a series resonance condition can occur and/or can be detected when a voltage on the electrostatic shield is within 10% of a relative minimum.

One example embodiment of the present disclosure is directed to a plasma processing apparatus. The plasma processing apparatus can include a plasma chamber configured to be able to hold a plasma. The plasma processing apparatus can include a dielectric window forming at least a portion of a wall of the plasma chamber. The plasma processing apparatus can include a gas supply configured to supply a process gas to the plasma chamber. The plasma processing apparatus can include an inductive coupling element located proximate the dielectric window. The inductive coupling element can be configured to generate a plasma from the process gas in the plasma chamber when energized with radio frequency (RF) energy. The plasma processing apparatus can include a processing chamber having a workpiece support configured to support a workpiece. The processing chamber can be in fluid communication with the plasma chamber. The plasma processing apparatus can include an electrostatic shield located between the inductive coupling element and the dielectric window. The electrostatic shield can be grounded via a tunable reactive impedance circuit to a ground reference. The electrostatic shield can have a stray capacitance to the ground reference. The tunable reactive impedance circuit can be configured to adjust a reactance range between the electrostatic shield and the ground reference between a condition of capacitive reactance and a condition of inductive reactance at a frequency of RF energy supplied to the inductive coupling element. The reactance range can include an inductive reactance sufficient to achieve a parallel resonance condition with the stray capacitance between the electrostatic shield and the ground reference.

In some embodiments, the plasma processing apparatus can include a baffle structure. The baffle structure can include a plurality of dielectric restricting elements. At least two of the plurality of dielectric restricting elements can be separated by a gap. The gap can be less than about 1 cm in width. In some examples, the plurality of dielectric restricting elements can include a plurality of dielectric chamber liners mounted generally parallel to a grounded side wall of the processing chamber. In some implementations, the baffle structure can be located between the plasma chamber and the processing chamber. The baffle structure can have a diameter in a range of about 10% to about 70% of a diameter of the plasma chamber. The baffle structure can be configured to absorb one or more charged species from the plasma. In some instances, a center of the baffle structure can be located above an approximate center of the workpiece support.

In some embodiments, the tunable reactive impedance circuit can include an inductor and a variable capacitor connected in series. A range of capacitance of the variable capacitor has a lower limit that is less than 0.9*$C_S$/a and an upper limit that is greater than about $C_S$/(a−1), where $C_S$ is the stray capacitance between the electrostatic shield and the ground reference and a is a constant that is greater than about 1.01.

In some embodiments, the plasma processing apparatus can include a second tunable reactive impedance circuit coupled between the electrostatic shield and the inductive coupling element. The second tunable reactive impedance circuit can be configured to adjust a reactance between the inductive coupling element and an electrostatic shield between a condition of capacitive reactance and a condition of inductive reactance at the frequency of RF energy supplied to the inductive coupling element.

Another example embodiment of the present disclosure is directed to a plasma processing apparatus. The plasma processing apparatus can include a plasma chamber configured to be able to hold a plasma. The plasma processing apparatus can include a dielectric window forming at least a portion of a wall of the plasma chamber. The plasma processing apparatus can include a gas supply configured supply a process gas to the plasma chamber. The plasma processing apparatus can include an inductive coupling element located proximate the dielectric window. The inductive coupling element can be configured to generate a plasma from the process gas in the plasma chamber when energized with radio frequency (RF) energy. The plasma processing apparatus can include a processing chamber having a workpiece support configured to support a workpiece. The processing chamber can be in fluid communication with the plasma chamber. The plasma processing apparatus can include an electrostatic shield located between the inductive coupling element and the dielectric window. The electrostatic shield associated with a stray capacitance between the inductive coupling element and the electrostatic shield. The plasma processing apparatus can include a tunable reactive impedance circuit coupled between the inductive coupling element and the electrostatic shield. The tunable reactive impedance circuit can be configured to adjust a reactance between the inductive coupling element and the electrostatic shield between a condition of capacitive reactance and a condition of inductive reactance at a frequency of RF energy supplied to the inductive coupling element. The tunable reactive impedance circuit can be operable to achieve an inductive reactance at least approximately equal to the capacitive reactance of the stay capacitance.

In some embodiments, the tunable reactive impedance circuit can include an inductor and a variable capacitor connected in series. The inductor can have inductance value greater than $1/(\omega\ C_S)$ for co the frequency of the energy supplied to the inductive coupling element and $C_S$ is the stray capacitance between the electrostatic shield and the ground reference. The variable capacitor can have a range such that the tunable reactive impedance circuit can achieve a series resonance condition between inductive coupling element and the electrostatic shield.

In some embodiments, the plasma processing apparatus can include a plurality of dielectric restricting elements. At least two of the plurality of dielectric restricting elements are separated by a gap. The gap is less than about 1 cm in width. In some cases, the plurality of dielectric restricting elements comprise a plurality of dielectric chamber liners mounted generally parallel to a grounded side wall of the processing chamber In some embodiments, the plasma processing apparatus can include a baffle structure configured to absorb one or more charged species from the plasma. In some implementations, the baffle structure can be located between the plasma chamber and the processing chamber. The baffle structure has a diameter in a range of about 10% to about 70% of a diameter of the plasma chamber. A center of the baffle structure can be located above an approximate center of the workpiece support.

Another example embodiment of the present disclosure is directed to a plasma processing apparatus. The plasma processing apparatus can include a plasma chamber configured to be able to hold a plasma. The plasma processing apparatus can include a dielectric window forming at least a portion of a wall of the plasma chamber. The plasma processing apparatus can include a gas supply configured supply a process gas to the plasma chamber. The plasma processing apparatus can include an inductive coupling element located proximate the dielectric window. The inductive coupling element can be configured to generate a plasma from the process gas in the plasma chamber when energized with radio frequency (RF) energy. The plasma processing apparatus can include a processing chamber having a workpiece support configured to support a workpiece. The processing chamber can be in fluid communication with the plasma chamber. The plasma processing apparatus can include an electrostatic shield located between the inductive coupling element and the dielectric window. The electrostatic shield can be grounded via a first tunable reactive impedance circuit. The first tunable reactive impedance circuit can be configured to adjust a reactance between the inductive coupling element and a ground reference in a range from an inductive reactance to a capacitive reactance. The plasma processing apparatus can include a second tunable reactive impedance circuit coupled between the inductive coupling element and the electrostatic shield. The second tunable reactive impedance circuit can be configured to adjust a reactance between the inductive coupling element and the electrostatic shield in a range from an inductive reactance to a capacitive reactance.

In some embodiments, the first tunable reactive impedance circuit is operable to achieve a parallel resonance condition with a stray capacitance between the electrostatic shield and the ground reference. For instance, in some embodiments, the first tunable reactive impedance circuit can include an inductor and a variable capacitor coupled in series. The variable capacitor has a range operable to achieve a series resonance condition with the inductor in the first tunable impedance circuit at the frequency of the RF energy supplied to the inductive coupling element.

In some embodiments, the second tunable reactive impedance circuit can be operable to achieve a parallel resonance condition with a stray capacitance between the inductive coupling element to the electrostatic shield at the frequency of the RF energy supplied to the inductive coupling element. For instance, in some embodiments, the second tunable reactive impedance circuit is operable to achieve a net capacitive reactance of less than about 50 ohms, in the absence of plasma, between the inductive coupling element and the electrostatic shield at the frequency of the RF energy supplied to the inductive coupling element.

Another example embodiment of the present disclosure is directed to a method for processing a workpiece. The method can include admitting a process gas into a plasma chamber. The method can include exciting with RF energy an inductive coupling element to initiate ignition of a plasma induced in the process gas. The method can include adjusting an RF voltage of an electrostatic shield located between the inductive coupling element and the plasma chamber. The electrostatic shield can have a stray capacitance to a ground reference. The method can include conducting an ion-assisted etching process on the workpiece based at least in part on the RF voltage of the electrostatic shield. Adjusting the RF voltage of the electrostatic shield can include adjusting a first tunable reactive impedance circuit coupled between the electrostatic shield and a ground reference to a condition of inductive reactance such that, in the absence of plasma, a total impedance between the electrostatic shield and the ground reference has a magnitude that is at least twice a magnitude of an impedance of the stray capacitance between the electrostatic shield and the ground reference at a frequency of the RF energy supplied to the inductive coupling element.

In some embodiments, adjusting the RF voltage of the electrostatic shield can include adjusting the first tunable reactive impedance circuit coupled between the electrostatic shield and a ground reference such that the first tunable reactive impedance circuit produces a parallel resonance condition with the stray capacitance from the electrostatic shield to the ground reference at the frequency of the RF energy supplied to the inductive coupling element.

In some embodiments, adjusting the RF voltage of the electrostatic shield can include adjusting a second tunable reactive impedance circuit coupled between the electrostatic shield and the inductive coupling element to produce a total impedance, in the absence of plasma, between electrostatic shield and the inductive coupling element having a magnitude that is less than half a magnitude of an impedance of a stray capacitance between the electrostatic shield and the inductive coupling element In some embodiments, the RF voltage of the electrostatic shield can be adjusted to be greater than about 100 $V_{RMS}$. The first tunable reactive impedance circuit can include an inductor and a capacitor coupled in series. The second tunable reactive impedance circuit can include an inductor and a capacitor coupled in series. The stray capacitance from the electrostatic shield to the ground reference can be in a range of about 20 picofarads to about 2000 picofarads.

Another example embodiment of the present disclosure is directed to a method for processing a workpiece. The method can include admitting a process gas into a plasma chamber. The method can include exciting with RF energy an inductive coupling element to initiate ignition of a plasma induced in the process gas. The method can include adjusting an RF voltage of an electrostatic shield located between the inductive coupling element and the plasma, wherein the electrostatic shield has a stray capacitance to a ground reference. The method can include conducting an isotropic etching process on the workpiece based at least in part on the RF voltage of the electrostatic shield. Adjusting the RF voltage of the electrostatic shield can include adjusting a first tunable reactive impedance circuit coupled between the electrostatic shield and the ground reference to have a net capacitive reactance such that the first tunable reactive impedance circuit, in the absence of plasma, produces a total impedance between the electrostatic shield and the ground reference that is less than half a magnitude of an impedance of the stray capacitance between the electrostatic shield and the ground reference at a frequency of the RF energy supplied to the inductive coupling element.

In some embodiments, adjusting the RF voltage of the electrostatic shield can include adjusting the first tunable reactive impedance circuit coupled between the electrostatic shield and the ground reference such that the first tunable reactive impedance circuit produces a series resonance condition with the stray capacitance from the electrostatic shield to the ground reference at the frequency of the RF energy supplied to the inductive coupling element.

In some embodiments, adjusting the RF voltage of the electrostatic shield can include adjusting a second tunable reactive impedance circuit coupled between the electrostatic shield and the electrostatic shield to produce a total impedance, in the absence of plasma, between electrostatic shield and the inductive coupling element having a magnitude that is more than twice the magnitude of an impedance of a stray capacitance between the electrostatic shield and the ground reference.

In some embodiments, adjusting the RF voltage of the electrostatic shield can include adjusting a second tunable reactive impedance circuit coupled between the electrostatic shield and a ground reference inductive coupling element to produce a net inductive reactance of this second tunable circuit that has series parallel resonance condition with the stray capacitance between shield and inductive coupling element at the frequency of the RF energy supplied to the inductive coupling element.

In some embodiments, the RF voltage of the electrostatic shield is adjusted to be less than or equal to about 10 $V_{RMS}$. An impedance of the first tunable reactive impedance circuit can be set to be less than or equal to about 5 Ohms at a frequency of the RF energy supplied to the inductive coupling element. The stray capacitance from the inductive coupling element to the electrostatic shield can be in a range of about 5 picofarads to about 1000 picofarads.

Another example embodiment of the present disclosure is directed to a method for processing a workpiece. The method can include admitting a process gas into a plasma chamber. The method can include exciting with RF energy an inductive coupling element to initiate ignition of a plasma induced in the process gas. The method can include adjusting an RF voltage of an electrostatic shield disposed between an inductive coupling element and the plasma chamber to obtain a first RF voltage of the electrostatic shield, the electrostatic shield associated with a stray capacitance to a ground reference. The method can include conducting an ion-assisted etching process on the workpiece based at least in part on the first RF voltage of the electrostatic shield. The method can include adjusting the RF voltage of the electrostatic shield to obtain a second RF voltage of the electrostatic shield. The method can include conducting an isotropic etching process on the workpiece based at least in part on the second RF voltage of the electrostatic shield. Adjusting the RF voltage of the electrostatic shield to obtain the first RF voltage of the electrostatic shield can include adjusting a first tunable reactive impedance circuit coupled between the electrostatic shield and a ground reference such that at a total impedance in the absence of plasma between the electrostatic shield and the ground reference is a first magnitude. Adjusting the RF voltage of the electrostatic shield to obtain the second RF voltage of the electrostatic shield can include adjusting the first tunable reactive impedance circuit coupled between the electrostatic shield and a ground reference such that at a total impedance in the absence of plasma between the electrostatic shield and the ground reference is a second magnitude. The second magnitude can be less than the first magnitude.

In some embodiments, adjusting the RF voltage of the electrostatic shield to obtain the first RF voltage of the electrostatic shield can include adjusting a second tunable reactive impedance circuit coupled between the electrostatic shield and the inductive coupling element such that a total impedance in the absence of plasma between the electrostatic shield and the inductive coupling element is a third magnitude; and adjusting the RF voltage of the electrostatic shield to obtain the second RF voltage of the electrostatic shield can include adjusting the second tunable reactive impedance circuit coupled between the electrostatic shield and the inductive coupling element such that at a total impedance in the absence of plasma between the electrostatic shield and the inductive coupling element is a fourth magnitude. The third magnitude can be less than the fourth magnitude.

In some embodiments, the first RF voltage of the electrostatic shield is greater than about 100 $V_{RMS}$, and the second RF voltage is less than about 10 $V_{RMS}$. Conducting the ion-assisted etching process is implemented at a setting of the first tunable reactive impedance circuit such that the total impedance in the absence of plasma of the electrostatic shield to the ground reference is greater than about 100 Ohms at a frequency of the RF energy supplied to the inductive coupling element, and conducting the isotropic etching process is implemented at a second impedance of the first tunable reactive impedance circuit of less than about 10 Ohms at the frequency of the RF energy supplied to the inductive coupling element.

In some embodiments, the first tunable reactive impedance circuit comprises a first inductor and a first capacitor coupled in series; and the second tunable reactive impedance circuit comprises a second inductor and a second capacitor coupled in series. At least one of the first inductor and the first capacitor is tunable and at least one of the second inductor and the second capacitor is tunable.

FIG. 1 depicts an example plasma processing apparatus according to example embodiments of the present disclosure. As illustrated, the plasma processing apparatus 100 includes a processing chamber 110 and a plasma chamber 120 that is distinct from the processing chamber 110 but whose volume is connected to the volume of the processing chamber such that the processing chamber is in fluid communication with the plasma chamber. The processing chamber 110 includes a workpiece support or pedestal 112 configured to support or hold a workpiece 114 to be processed, such as a semiconductor wafer. The workpiece support or pedestal 112 can be grounded. In this example illustration, a plasma is generated in the plasma chamber 120 (i.e., plasma generation region) by an inductively coupled plasma source 135 and desired species are channeled from the plasma chamber 120 to the surface of workpiece 114 through and around a baffle structure (e.g., separation baffle 200). The baffle structure (e.g., separation baffle) can be configured to absorb charged species from a plasma.

The plasma chamber 120 includes a dielectric side wall 122 (also referred to as a dielectric window) and a ceiling 124 (also referred to as a conducting top cover). The dielectric side wall 122, ceiling 124, and separation baffle 200 define a plasma chamber interior 125. The dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to the RF power output of an RF generator 134 through a suitable matching network 132. Process gases can be provided to the chamber interior from a gas supply 150 and annular gas distribution channel 151 or other suitable gas introduction mechanism. Examples of the process gases can include one or more of oxygen ($O_2$), hydrogen ($H_2$), nitrogen ($N_2$), argon (Ar), helium (He), carbon monoxide (CO), carbon dioxide ($CO_2$), ammonia ($NH_3$), methane ($CH_4$), $H_2O$, chlorine ($Cl_2$), boron tribromide ($BBr_3$), boron trichloride ($BCl_3$), and one or more fluorinated gases including tetrafluoromethane ($CF_4$), nitrogen trifluoride ($NF_3$), sulfur hexafluoride ($SF_6$), hydrogen fluoride (HF), fluorine ($F_2$). When the induction coil 130 (the inductive coupling element) is energized with RF power from the RF power generator 134, a plasma can be generated in the plasma chamber 120. In a particular embodiment, the plasma processing apparatus 100 can include an electrostatic shield 128 (e.g., a Faraday shield, or a shield having conducting material) to reduce capacitive coupling of the induction coil 130 to the plasma. The metal walls of the processing chamber 110 and the pedestal 112 are grounded.

According to example aspects of the present disclosure, as can be seen in FIG. 1, the electrostatic shield 128 is located between the induction coil 130 and the dielectric side wall 122. The electrostatic shield 128 is grounded (e.g., via a grounded enclosure 170) via a first tunable reactive circuit 145. The first tunable reactive circuit 145 can include a variable impedance which in some embodiments is a substantially reactive impedance. The variable impedance can be provided by a series LC circuit with a variable capacitor and/or variable inductor to allow the impedance of the first tunable reactive circuit 145 to be varied over a wide range. The first and/or second tunable circuits each may also include along with inductor(s) and capacitor(s) a modest (<10 Ohms) electrical resistance (not shown in FIG. 1) that helps broaden the capacitance range for parallel resonance and makes tuning of the circuit more stable. The electrostatic shield 128 is in some embodiments also connected to the ceiling 124 of the plasma chamber 120 such that the ceiling 124 can conduct RF current to/from the plasma generated by the induction coil 130 directly or through a thin dielectric liner (not shown in FIG. 1) to the electrostatic shield 128 and then to ground through the first tunable reactive circuit 145.

According to example aspects of the present disclosure, as can be seen in FIG. 1, the electrostatic shield 128 is also connected to the induction coil 130 through a second tunable reactive circuit 160. The second tunable reactive circuit 160 can include a variable impedance that may be primarily reactive. The variable impedance can be provided by a series LC circuit with a variable capacitor and/or variable inductor to allow the impedance of the second tunable reactive circuit 160 to be varied over a wide range. In some embodiments this primarily reactive impedance may include a small resistor (approximately <10 Ohms) that has much less impedance than either inductor or capacitor but is sufficient to broaden the capacitance range of the resonance so that the resonant condition is more stable.

As can be seen in FIG. 1, the plasma processing apparatus 100 further includes a controller 140 and a voltage sensor 142. The controller 140 controls the RF power generator 134, the first tunable reactive circuit 145, and the second tunable reactive circuit 160 to adjust a plasma potential based on a voltage of the electrostatic shield 128. The voltage sensor 142 measures a voltage of the electrostatic shield 128, in some embodiments where it is nearest to the induction coil 130, and provides signals that may be analog or digital, indicative of the measured voltage of the electrostatic shield 128 to the controller 140. In some embodiments, the controller 140 can control the RF power generator 134, the first tunable reactive circuit 145, and the second tunable reactive circuit 160 based on a "recipe" for the process conditions, including a range of voltages for the signals received from the voltage sensor 142.

As can be seen in FIG. 1, the controller 140 controls the RF power generator 134 to provide a RF power to the plasma via an RF current to the induction coil 130. In some embodiments, for igniting the plasma, the controller 140 can control the voltage of the electrostatic shield 128 to be greater than about 10 $V_{RMS}$, and up to about 100 $V_{RMS}$. The plasma can be ignited by an RF electrostatic field (not shown in FIG. 1) that is set up at the interior surface of the dielectric side wall 122 adjacent the electrostatic shield 128. The voltage sensor 142 can measure the voltage at a designated point on the electrostatic shield 128 and can provide a measured voltage of the electrostatic shield 128 to the controller 140. The controller 140 can adjust the voltage of the electrostatic shield 128 to be within a desired range by adjusting the variable impedance of the first tunable reactive circuit 145 and/or the second tunable reactive circuit 160 based on a measured voltage of the electrostatic shield provided by the voltage sensor 142 to provide for a closed loop control.

In some embodiments, the controller 140 can adjust the voltage of the electrostatic shield 128 among a range between less than about 1 $V_{RMS}$ to about 200 $V_{RMS}$ by adjusting an impedance of the first tunable reactive circuit 145 in a range from about 10 Ohms to 100 Ohms at a principal frequency of RF current provided by the induction coil 130 and further adjusting the second tunable reactive circuit 160. In some embodiments, the controller 140 can adjust reactive impedances of both first and second reactive impedance circuits to adjust the RF voltage on the electrostatic shield for a particular process step to provide desired level of ion bombardment for that process step.

For instance, in some embodiments, to increase the voltage of the electrostatic shield 128 (e.g., for an ion-assisted etching process), the controller 140 can tune the first tunable reactive circuit 145 to produce a substantially parallel resonance between the first tunable reactive impedance circuit 145 and a stray capacitance ($C_S$) from the electrostatic shield 128 to a ground reference. The controller 140 can further tune the second tunable reactive circuit 160 to produce a substantially series resonance of an inductor and a capacitor within the second tunable reactive impedance circuit 160. In some embodiments the second reactive circuit may be tuned to be capacitive with reactance of between about 100 Ohms and about 25 Ohms to increase the RF current to the shield from the inductive coupling element. In some embodiments, to reduce the voltage of the electrostatic shield 128 (e.g., an isotropic etching process), the controller 140 can tune the first tunable reactive circuit 145 to produce a substantially series resonance of an inductor and a capacitor within the first tunable reactive impedance circuit 145. The controller 140 can tune the second tunable reactive circuit 160 to produce a substantially parallel resonance between the second tunable reactive impedance circuit 160 and a stray capacitance ($C_A$) from the inductive coupling element to the electrostatic field 128 thereby providing for minimal RF voltage on the shield.

In some embodiments, the controller 140 can control the first tunable reactive circuit 145 and the second tunable reactive circuit 160 independently to increase or decrease the voltage of the electrostatic shield 128. For instance, the controller 140 can tune the first tunable reactive circuit 145 alone to increase or decrease the voltage of the electrostatic shield 128 for various applications, e.g., plasma ignition, ion-assisted etching processes, and/or isotropic etching processes. The controller 140 can tune the second tunable reactive circuit 160 alone to increase or decrease the voltage of the electrostatic shield 128 for such applications.

The controller 140 and/or any of the controllers or other control devices disclosed here can include one or more processors and one or more memory devices. The one or more memory devices can store computer-readable instructions that when executed by the one or more processors to perform operations. The operations can include, for instance, tuning the variable impedance coupled between the electrostatic shield 128 and ground, and/or tuning the variable impedance coupled between the electrostatic shield 128 and the induction coil 130. The operations can include, for instance, controlling the RF generator 134. The controller 140 can perform other operations associated with the plasma processing apparatus.

According to example aspects of the present disclosure, as can be seen in FIG. 1, the separation baffle 200 separates the plasma chamber 120 from the processing chamber 110. The separation baffle 200 can block one or more portions of a flow path for the plasma and gas from the region of plasma generation to the workpiece 114 to partially absorb or divert charged particles from a gas stream flowing down from the plasma chamber 120 to the workpiece 114. The separation baffle 200 can be used to perform ion baffling and separation of charged versus neutral species from a mixture generated by plasma in the chamber 120 to generate a filtered mixture. The filtered mixture can be exposed to the workpiece 114 in the processing chamber 110. The separation baffle 200 can also help to reshape the distribution of neutral species across the workpiece 114 since the flow rate through the separation baffle 200 is substantially lower than through one or open areas around the separation baffle 200.

In some embodiments, the separation baffle 200 can have no holes so that gas does not flow through the separation baffle 200, e.g., a disk with no holes. In some embodiments, the separation baffle 200 can have a disc shape and cover area symmetrically about a center axis of a cylindrical plasma source volume such that a center of the separation baffle 200 is located above an approximate center of the workpiece support. For instance, one or more portions of separation baffle 200 that block the one or more portions of the flow path can be arranged symmetrically about a center axis of the induction coil 130.

In some embodiments, a diameter of the separation baffle 200 located at a position in the plasma chamber 120 can be in a range of about 0.1 to about 0.7 of a diameter of the plasma chamber 120 at that position. For instance, the separation baffle 200 can cover only a fraction (e.g., less than about 50%, such as less than about 10%) of the flow area from the induction coil 130 to the workpiece 114. In some embodiments, the separation baffle 200 can be round and symmetrical with its center located above a center of the workpiece 114 such that the plasma can diffuse or flow around the separation baffle 200 with the gas down to the workpiece 114. The separation baffle 200 can be made of an electrical insulating material or an electrical conducting material. In some embodiments, the separation baffle 200 can be between about 5 cm from the workpiece and about 20 cm from the workpiece 114.

In some embodiments, the separation baffle 200 can have multiple holes that allow some gas flowing through the separation baffle 200. For instance, the separation baffle 200 can be a small grid 210 with multiple small holes. The grid 210 covers only a fraction of the cross-sectional area of the volume 125 of the plasma chamber 120. Neutral species can pass through the grid 210 while charged particles usually do not. The gas flow can be substantially around the grid 210 but a smaller fraction of charged as well as neutral species move around the grid 210 into areas near a symmetry axis of the grid 210. Thus, this can help make the processing rate more uniform by reducing the rate in the center of the workpiece 114 where it is usually higher.

In some embodiments, a hole diameter can be of the same order or the same size as thickness of the separation baffle

200 such that most ions cannot penetrate through the separation baffle. In some embodiments, the separation baffle 200 can be made of conducting material, such as metal, silicon, carbon or other materials with some measure of electrical conduction.

In some embodiments, the separation baffle 200 can be electrically biased by an external power supply 215. This bias voltage can be controllable by the controller 140 for the processing chamber 110. The bias voltage can be varied from process to process or step to step within the process for a single workpiece. In this case, a wire or conducting strut or support can be used to provide electric current to the separation baffle 200 from the external power supply 215.

In some embodiments, the separation baffle 200 can cause the plasma to have a uniform density profile above the workpiece 114 such that processing for the workpiece 114 can be uniform. In some embodiments, area of the separation baffle 200 can be up to about 50%, to as little as about 10% of a cross-sectional area of the flow path from the induction coil 130 to the workpiece 114. The separation baffle 200 can be made of electrical insulator material or conducting material. The separation baffle 200 that is made of conducting material can be grounded electrically or floating electrically. In some embodiments, the separation baffle 200 cannot be electrically biased such that the separation baffle 200 can cause enhanced ion collection, or can receive ion bombardment, or cause potential of the plasma to be elevated.

In some embodiments, the separation baffle 200 can be a complete separation grid when performing an isotropic etching process, such that an entire flow of gas from the plasma chamber 120 flows through the separation baffle 200 to reach the workpiece 114. The separation baffle 200 can partially or nearly completely absorb charged particles from the gas stream flowing down from the plasma chamber 120 to the workpiece 114 to reduce electrical charging of the workpiece 114 and potential ion damage to the workpiece 114. When charged particles are needed for the process, the RF plasma potential of the induction coil 130 can be increased to a point where hollow anode discharges are ignited in the separation baffle 200 when it is grounded such that ionization occurs in the holes in the separation baffle 200 thereby producing separately a plasma in the gas volume below the separation baffle 200 but directly above the workpiece 114.

Figure 2:
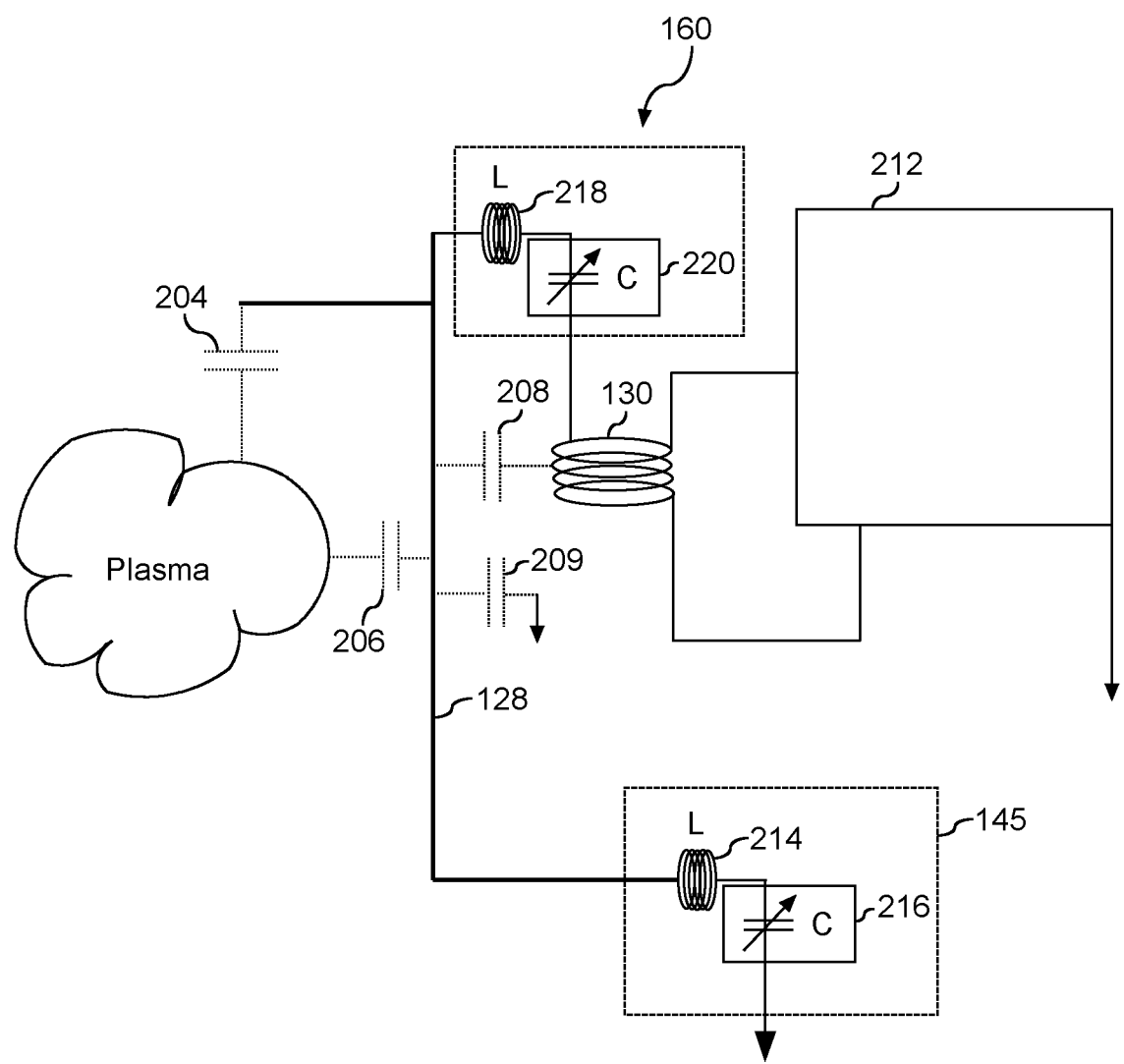
FIG. 2 depicts an example equivalent circuit of a plasma processing apparatus according to example embodiments of the present disclosure.

FIG. 2 depicts an example equivalent circuit 202 of the plasma processing apparatus 100 according to example embodiments of the present disclosure. As can be seen in FIG. 2, a capacitive coupling 204 is between the plasma and the cap (also referred to as a ceiling) 124 (not shown in FIG. 2). The cap 124 can be an electrically conducting material that provides the ceiling for the plasma volume. The cap 124 may be connected to ground, or may be electrically floating, or may not be connected to the shield. When the cap 124 is connected to the electrostatic shield 128, as shown in FIG. 2, the capacitances 204 and 206 can act in parallel to provide RF current from the electrostatic shield 128 to the plasma. In some embodiments, the capacitive coupling 204 and the capacitive coupling 206 are dependent on plasma conditions. The capacitance 206 between the plasma and the electrostatic shield 128 depends on the dielectric wall material and the sheath thickness at the dielectric wall surface. This capacitance causes RF current to flow from the electrostatic shield 128 to the plasma which thereby can cause the plasma to sustain an RF electrical potential. A capacitive coupling 208 ($C_A$) is between the electrostatic shield 128 and the induction coil 130 that is also coupled to an RF power supply 212 that can include the suitable matching network 132 and the RF power generator 134. The free-space (air-gap) capacitance 209 between the electrostatic shield 128 and the electrically grounded enclosure (not shown) is called $C_S$. The electrostatic shield 128 is connected through the first tunable circuit 145 including an inductor 214 and a variable capacitor 216 to ground. In some embodiments this may also include a small resistance (not shown in FIG. 2) to stabilize the total impedance from shield to ground when the tunable circuit is near parallel resonance condition with the capacitance $C_S$. This tunable circuit can effectively act in parallel with the stray capacitance 209 ($C_S$) between the electrostatic shield 128 and ground, which can be between about 20 picofarads and about 2000 picofarads. A capacitance of the capacitive coupling 208 can be between about 5 picofarads and about 1000 picofarads. Components 218 and 220 are the inductor and variable capacitor, respectively, that are included in the second tunable reactive circuit 160 that connects the induction coil 130 to the electrostatic shield 128. Tuning of the variable capacitor 220 in this illustrated embodiment can permit the total impedance between the electrostatic shield 128 and the induction coil 130 to be varied over a very wide range resulting in a great improvement in the range of voltage of the RF plasma potential and hence the energy of ions bombarding the workpiece.

In some embodiments, the second tunable reactive circuit 160 can be tuned to have a low total impedance, a moderate capacitive reactance or tuned to have parallel resonance with stray capacitance $C_A$. In the low total impedance case, there can be substantial RF current flow from the induction coil 130 to the electrostatic shield 128 and the RF voltage on the electrostatic shield 128 can be closer in amplitude to that on the induction coil 130 (e.g., as much as five hundred Volts or more) especially if the first tunable circuit is used in a high impedance state—such as at or near parallel resonance with capacitance $C_S$ 209. The voltage on the shield can also be substantial if the second circuit is tuned to a moderate capacitive reactance (<100 Ohms) thereby providing increased RF current from coil to shield. The voltage on the electrostatic shield 128 can be increased (e.g., maximized) by appropriately controlling circuits with the inductor 218 and the capacitor 220. The second tunable reactive circuit 160 can also be adjusted to have a low (e.g., minimum) impedance, which can be achieved if the second tunable reactive circuit 160 is tuned so the capacitive reactance nullifies the inductive reactance of the circuit.

To increase the maximum possible voltage of the electrostatic shield, the first tunable reactive circuit 145 can also be tuned by adjusting the capacitor 216 so that the total reactance of the first tunable reactive circuit 145, including all elements in the circuit, can have the same magnitude (but opposite sign) as the capacitive reactance of the capacitance 209 from the electrostatic shield 128 to ground. In this case, there can be parallel resonance of the first tunable reactive circuit 145 with the air-gap and other contributors to the stray capacitance ($C_S$) of the electrostatic shield 128 to ground and the impedance to ground of the electrostatic shield 128 (absent plasma) can be substantially increased (e.g., maximized). This can provide for low (e.g., minimum) ground currents from the electrostatic shield 128 and thereby a high (e.g., maximum) RF voltage on the electrostatic shield 128. This RF voltage then can cause a high (e.g., maximum) RF current coupling capacitively from the electrostatic shield 128 to plasma resulting in a high (e.g., highest) sheath voltage from the plasma to the workpiece 114 giving a high (e.g., highest) ion energies bombarding the workpiece 114.

In some embodiments, when the first tunable reactive circuit 145 is tuned to a series resonance of the capacitor 216 and the inductor 214, this can effectively ground the electrostatic shield 128. Then if the second tunable reactive circuit 160 is tuned to parallel resonance with air gap capacitance 208 ($C_A$) from the induction coil 130 to the electrostatic shield 128. There can be a low (e.g., minimum) RF current from induction coil 130 to the electrostatic shield 128. As a result, the shield RF voltage can be low (e.g., very close to zero Volts).

Figure 3:
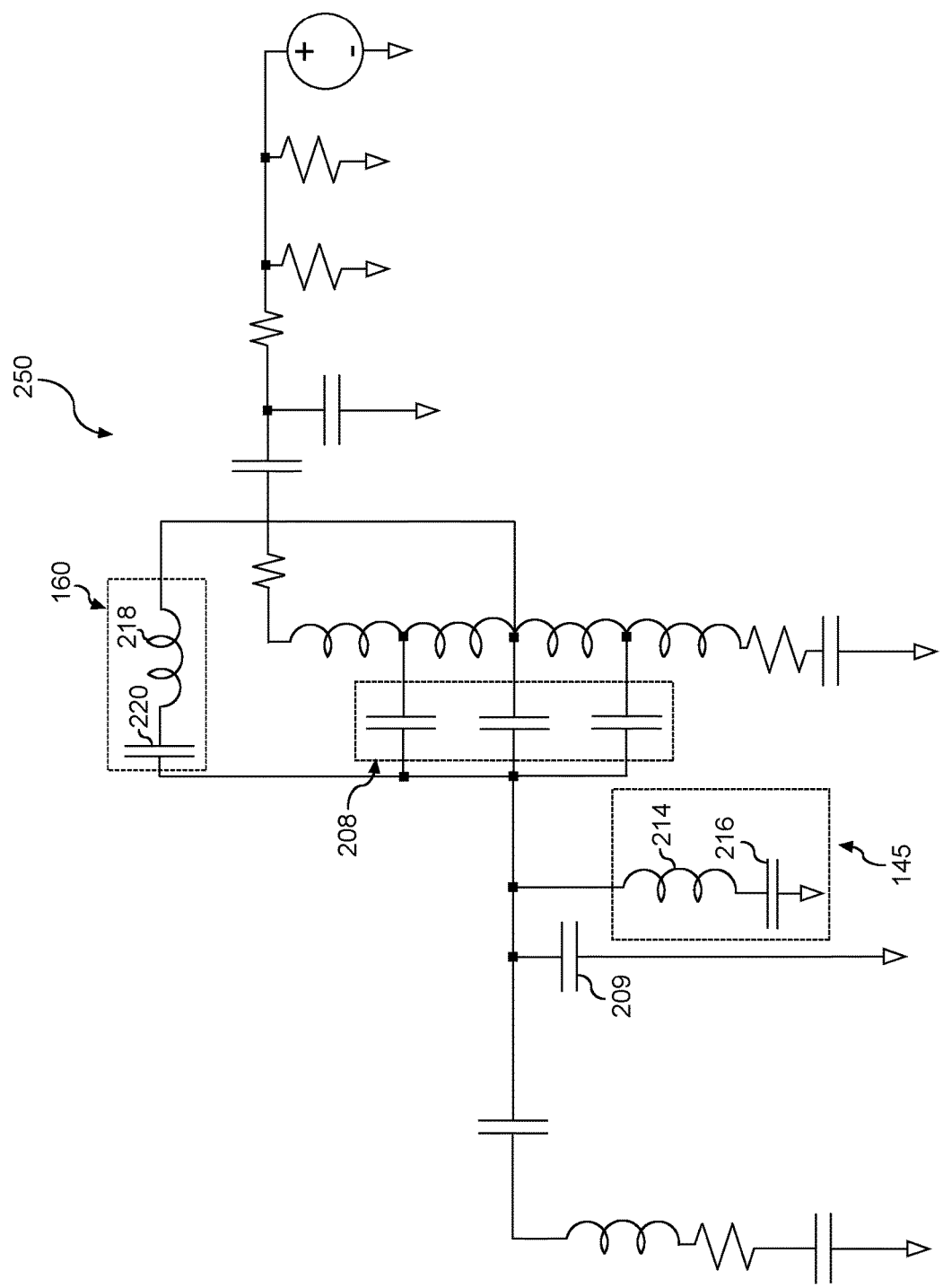
FIG. 3 depicts an example equivalent circuit of a plasma processing apparatus according to example embodiments of the present disclosure.

FIG. 3 depicts an example equivalent circuit 250 of the plasma processing apparatus 100 according to example embodiments of the present disclosure. As can be seen in FIG. 3, the first tunable reactive circuit 145 includes a series combination of an inductor 214 and a variable capacitor 216. The second tunable reactive circuit 160 includes a series combination of an inductor 218 and a variable capacitor 220. The first tunable reactive circuit 145 is arranged in parallel with the shunt capacitance (Cs) 209 to ground. The second tunable reactive circuit 160 is arranged in parallel with the capacitive coupling ($C_A$) 208. To increase the voltage of the electrostatic shield 128 (not shown in FIG. 3), the first tunable reactive circuit 145 can be adjusted to produce a parallel resonance between the first tunable reactive impedance circuit 145 and the stray capacitance ($C_S$) 209. The second tunable reactive circuit 160 can be adjusted to produce a series resonance of the inductor 218 and the capacitor 220. Alternatively, the second tunable reactive circuit can be tuned to have a relatively low capacitive reactance which thereby increases the RF current to the shield from the inductive coupling element resulting in higher RF voltage on the shield. To reduce the voltage of the electrostatic shield 128 (not shown in FIG. 3), the first tunable reactive circuit 145 can be adjusted to produce a series resonance of the inductor 214 and the variable capacitor 216. The shield voltage can be reduced even more if the second tunable reactive circuit 160 is then adjusted to produce a parallel resonance condition or nearly parallel resonant condition between the second tunable reactive impedance circuit 160 and the stray capacitance ($C_A$) 208.

Figure 4:
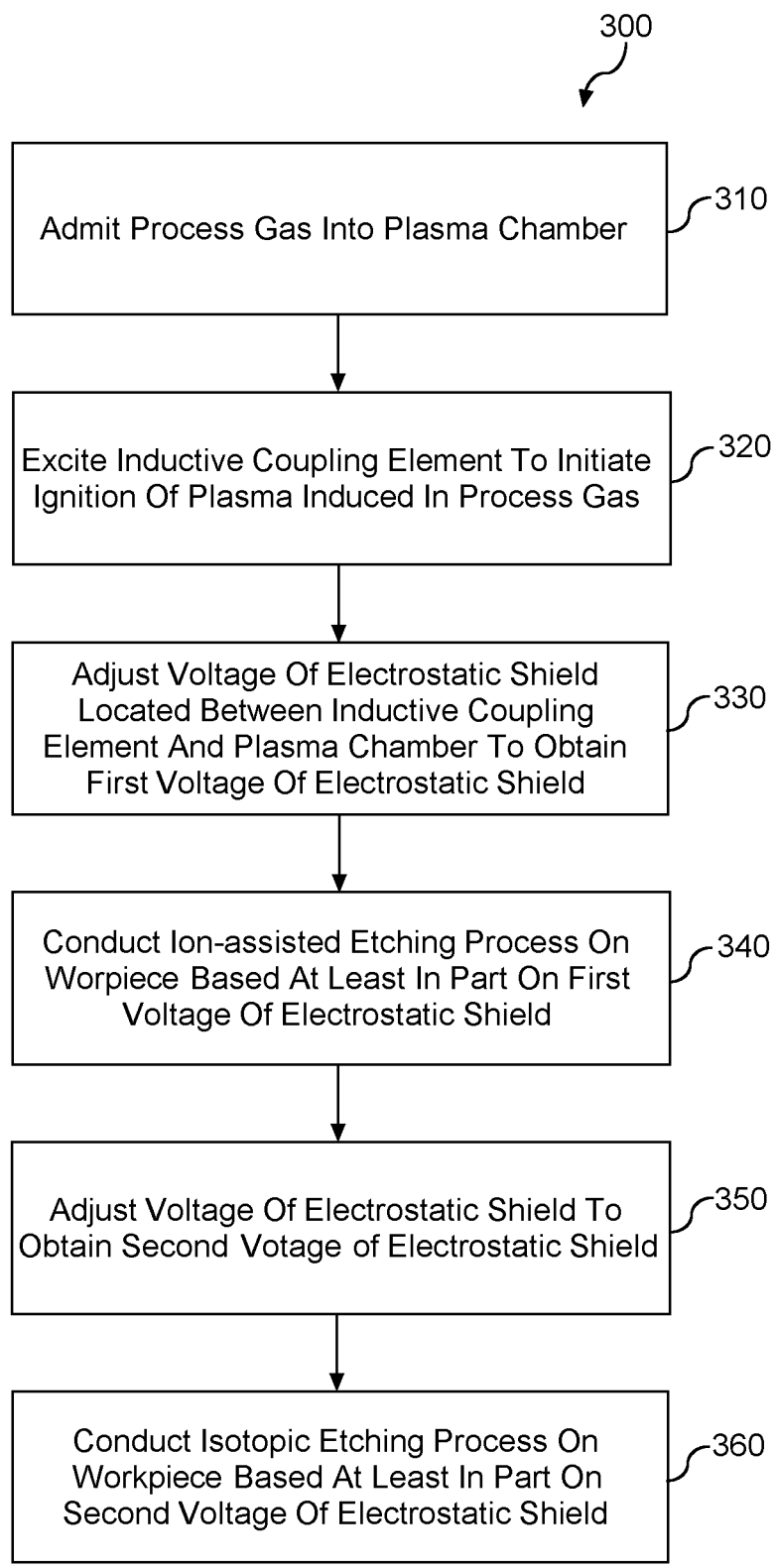
FIG. 4 depicts a flow diagram of an example method according to example embodiments of the present disclosure.

FIG. 4 depicts a flow diagram of an example method (300) according to example embodiments of the present disclosure. The method (300) can be implemented using the plasma processing apparatus 100 in FIG. 1. FIG. 4 depicts steps performed in a particular order for purposes of illustration and discussion for chamber configurations as in FIG. 1. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (310), the method can include admitting a process gas into a plasma chamber. For instance, one or more process gases can be provided to a chamber interior 125 from a gas supply 150 and an annular gas distribution channel 151 or other suitable gas introduction mechanism. Examples of the process gases can include one or more of oxygen ($O_2$), hydrogen ($H_2$), nitrogen ($N_2$), argon (Ar), helium (He), carbon monoxide (CO), carbon dioxide ($CO_2$), ammonia ($NH_3$), methane ($CH_4$), $H_2O$, chlorine ($Cl_2$), boron tribromide ($BBr_3$), boron trichloride ($BCl_3$), and one or more fluorinated gases including tetrafluoromethane ($CF_4$), nitrogen trifluoride ($NF_3$), sulfur hexafluoride ($SF_6$), hydrogen fluoride (HF), fluorine ($F_2$).

At (320), the method can include exciting an inductive coupling element to initiate ignition of a plasma induced in the process gas. For instance, prior to generating a plasma, a controller 140 can adjust a voltage of an electrostatic shield to generate a strike voltage (e.g., greater than or about 10 Volts RMS) to ignite the plasma. When the induction coil 130 is energized with RF power from the RF power generator 134, the plasma can be generated in the process gas in the plasma chamber 120.

At (330), the method can include adjusting a voltage of an electrostatic shield located between the inductive coupling element and the plasma chamber to obtain a first voltage of the electrostatic shield. For instance, to increase the voltage of the electrostatic shield 128 (e.g., greater than about 30 $V_{RMS}$), the controller 140 can tune the first tunable reactive circuit 145 to produce a substantially parallel resonant condition between the first tunable reactive impedance circuit 145 and a stray capacitance ($C_S$) 209 resulting in a very high impedance from the electrostatic shield 128 to a ground reference. For instance, an impedance of the parallel combination of first tunable reactive impedance circuit 145 and the capacitance $C_S$ can be set to be greater than about twice the reactive impedance of the stray capacitance $C_S$ 100. The controller 140 can further tune the second tunable reactive circuit 160 to produce a substantially series resonance of an inductor and a capacitor within the second tunable reactive impedance circuit 160 or a condition with a low absolute value of capacitive reactance such as less than about 50 Ohms.

In some embodiments, the second tunable reactive impedance circuit 160 can include a series combination of the inductor 218 and the capacitor 220. The inductor 218 can be a tunable inductor such that the inductor 218 is tuned in a range between 1 and 2 times a magnitude of reactance of a stray capacitance ($C_A$) 208 (e.g., where $C_A$ is in a range of about 20 picofarads to about 2000 picofarads) between the electrostatic shield 128 and the induction coil 130. In some embodiments, the capacitor 220 can be a variable capacitor such that the capacitor 220 is adjusted in a range between a first reactance magnitude and a second reactance magnitude. The first reactance magnitude can yield a net reactance greater than a magnitude of reactance of the stray capacitance ($C_A$) 208, when the first reactance magnitude is subtracted from a reactance of the inductor 218. The second reactance magnitude can be greater than the reactance of the inductor 218.

At (340), the method can include conducting an ion-assisted etching process on the workpiece based at least in part on the first voltage of the electrostatic shield. For instance, the first voltage can be adjusted to be at least about 30 $V_{RMS}$ or more so that the plasma potential can be at least about 10 $V_{RMS}$. As an example, the first voltage can be greater than about 50 Volts RMS, as a result, a RF plasma potential in some embodiments can be greater than about 20 Volts RMS. This can then provide for ion bombardment of the workpiece 114 with sufficient energy to activate reactive ion etching (RIE) reactions on the workpiece surface. The controller 140 can compare the measured value with a desired voltage of the electrostatic shield 128 to adjust the reactive impedance until the measured value is equal to the desired voltage.

At (350), the method can include adjusting the voltage of an electrostatic shield to obtain a second voltage of the electrostatic shield. For instance, to reduce the voltage of the electrostatic shield 128 (e.g., less than about 5 Volts), the controller 140 can tune the first tunable reactive circuit 145 to produce an approximate series resonance of an inductor and a capacitor within the first tunable reactive impedance circuit 145. For instance, an impedance of the first tunable reactive impedance circuit 145 can be set to be less than about 10 Ohms. The controller 140 can tune the second tunable reactive circuit 160 to produce an approximate parallel resonance between the second tunable reactive impedance circuit 160 and a stray capacitance ($C_A$) 208 from the inductive coupling element to the electrostatic field 128.

In some embodiments, the first tunable reactive impedance circuit 145 can include a series combination of the inductor 214 and the capacitor 216. The inductor 214 can be a tunable inductor such that the inductor 214 is tuned in a range between 1 and 2 times a magnitude of reactance of a stray capacitance ($C_S$) 209 (e.g., where $C_S$ is in a range of about 5 picofarads to about 1000 picofarads) between the electrostatic shield 128 and the ground reference. In some embodiments, the capacitor 216 can be a variable capacitor such that the capacitor 216 is adjusted in a range between an upper limit first capacitance and a second lower limit higher capacitance. The first upper limit capacitance when combined in series with the inductor can yield a net inductive reactance greater than a magnitude of reactance of the stray capacitance ($C_S$) 209, when the first reactance magnitude is subtracted from a reactance of the inductor 214. The second lower limit capacitance can have an absolute value of reactance greater than the reactance of the inductor 214 enabling a series resonant condition to be achieved.

At (360), the method can include conducting an isotropic etching process on the workpiece based at least in part on the second voltage of the electrostatic shield. For instance, the second voltage can be adjusted to be less that about 10 V amplitude (7 $V_{RMS}$) so that the energy of ion bombardment is sufficiently low (e.g., less than about 4 eV) that ion scattering in the gas produces a virtually isotropic ion distribution. The controller 140 can compare the measured value with a desired voltage of the electrostatic shield 128 to adjust the reactive impedance until the measured value is equal to the desired voltage.

In some embodiments, before a processing step, the controller 410 can adjust the reactive impedance to vary the magnitude of reactance of the first reactive circuit or second reactive circuit or both reactive circuits over a substantial range such that the voltage of the electrostatic shield 128 can be up to 200 $V_{RMS}$ or more for appropriate parallel resonant impedance values. In some embodiments, the controller 410 can adjust the reactive impedance(s) such that the voltage of electrostatic shield 128 can be less than 5 $V_{RMS}$ for approximate series resonance impedance values of the first tunable reactive circuit of the order of 10 Ohm or less.

In some embodiments, there can be three or more exemplary modes of operation: First, for striking the plasma or providing moderate ion bombardment energies (e.g., greater than about 5 eV, and less than about 50 eV) on the workpiece 114 in which the settings of the first tunable reactive circuit 145 provide a suitable RF shield voltage (e.g., greater than about 10 $V_{RMS}$, and less than about 100 $V_{RMS}$) by adjusting the first tunable reactive circuit to achieve a high total impedance from the electrostatic shield 128 to ground—by adjusting the first reactive circuit 145 to have nearly equal magnitude of inductive reactance as the capacitive reactance of shield to ground, $C_S$. Second, once plasma is struck and when an isotropic etching mode of operation is desired, in some embodiments the variable capacitor 216 of the first tunable reactive circuit 145 can be tuned to obtain series resonance of the first tunable circuit consisting of the inductor 214 and the capacitor 216 as shown in FIG. 2, causing the impedance of the first tunable reactive circuit 145 to be very low. This can result in a low RF voltage on the electrostatic shield 128. To achieve even lower voltages on the electrostatic shield 128 when plasma potential needs to be reduced (e.g., minimized), the impedance of the second tunable reactive circuit 160 can be set to be inductive and approximately equal in magnitude to the impedance of the air-gap capacitance $C_A$ between the induction coil 130 and the electrostatic shield 128. This can produce near parallel resonance condition between the second tunable circuit 160 and the air-gap capacitance $C_A$ 208 in FIG. 2, which substantially reduces the total RF currents from the induction coil 130 to the electrostatic shield 128 and makes the shield voltage even smaller. Finally, to achieve highest voltages on electrostatic shield 128 and high (e.g., maximum) ion bombardment energies at the workpiece 114, the first tunable reactive circuit 145 can be adjusted by making impedance of the first tunable reactive circuit 145 have a net inductive reactance equal in magnitude to the stray capacitance $C_S$ 209 in FIG. 2 which produces an increased value in the shield voltage as measured by the sensor 142 and controlled by the controller 140. Then the second tunable reactive impedance 160 can be adjusted to be net capacitive so that RF currents flowing from the induction coil 130 to the electrostatic shield 128 are greater than the current coming through the capacitance $C_A$ 208 in FIG. 2. The second tunable capacitive reactance can then be adjusted to reduce the capacitive reactance (by increasing the capacitance) of that tunable circuit to provide the desired value of shield voltage up to about 200 $V_{RMS}$ or more.

Aspects of the present disclosure are discussed with reference to two steps of the etch process for purposes of illustration and discussion. Those of ordinary skill in the art, using the disclosures provided herein, will understand that the etch process can include two or more process steps and various control parameters (e.g., values associated with the reactive impedances of the first and second tunable reactive circuits, and/or voltages of the electrostatic shield) for each step of the etch process such that the various control parameters can be adjusted at the beginning of the step and maintained at the desired values throughout the process step.

Figure 5:
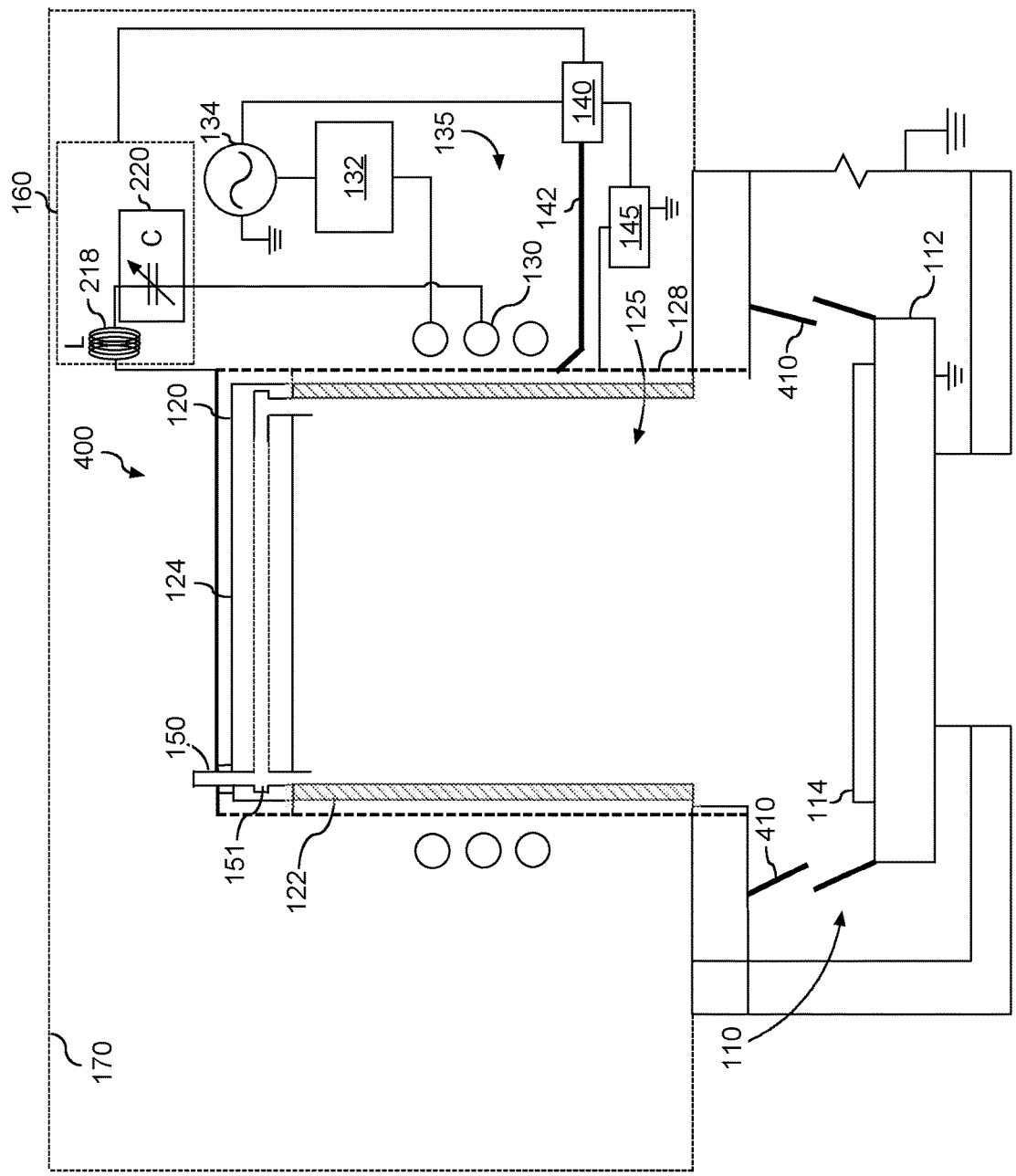
FIG. 5 depicts an example plasma processing apparatus according to example embodiments of the present disclosure.

FIG. 5 depicts an example plasma processing apparatus 400 according to example embodiments of the present disclosure. The plasma processing apparatus 400 is similar to the plasma processing apparatus 100 of FIG. 1. The plasma processing apparatus 400 includes both a plasma chamber interior 125 for formation of a plasma and a processing chamber 110 containing a workpiece support pedestal 112. A second tunable reactive circuit 160 includes an inductor 218 and a variable capacitor 220.

The controller 140 and/or any of the controllers or other control devices disclosed here can include one or more processors and one or more memory devices. The one or more memory devices can store computer-readable instructions that when executed by the one or more processors to perform operations. The operations can include, for instance, tuning the variable impedance coupled between the electrostatic shield 128 and ground, and/or tuning the variable impedance coupled between the electrostatic shield 128 and the induction coil 130. The operations can include, for instance, controlling the RF generator 134. The controller 140 can perform other operations associated with the plasma processing apparatus.

According to example aspects of the present disclosure, as can be seen in FIG. 5, the plasma processing apparatus 400 further includes multiple dielectric restricting elements 410 (e.g., dielectric partitions, dielectric baffles, or dielectric chamber liners) positioned in areas around the workpiece supporting pedestal 112. Partitions are as illustrated in FIG. 5, whereas liners (not shown in FIG. 5) may be closer to and parallel to the grounded walls, supported at a distance from a few mm to as much as about 10 millimeter from the grounded walls. These liners may permit gas to flow between liners and grounded walls but prevent plasma from accessing areas of grounded walls that they cover. The dielectric elements 410 collectively having narrow gaps (e.g., less than about 1 cm) between adjacent dielectric elements and to the workpiece support and for partitions or baffles as shown in FIG. 5, to the grounded walls of the processing chamber can restrict the plasma to prevent it from filing some part of the remaining volume of the processing chamber 110. These dielectric restricting elements are configured to cover only part of the grounded wall area, so that they permit the plasma to access other part(s) of the grounded wall area of the processing chamber but not the entire grounded wall area. Said elements are configured with gaps of about 1 centimeters or less between them, partitioning the volume of the second chamber into a first sub-volume and a second sub-volume that are fluidly connected through the gaps between dielectric restricting elements. In this manner, the wall area of the processing chamber 110 accessible to the plasma for RF current conduction to ground is restricted and in some embodiments can be limited to have an area comparable to or smaller than the area of the electrostatic shield 128 and the ceiling 124. Therefore, the area of the grounded wall to which the plasma is proximate and able to conduct RF current is reduced as compared with FIG. 1 which causes the RF and DC electrical potential of the plasma to be increased relative to those plasmas in FIG. 1.

Figure 6:
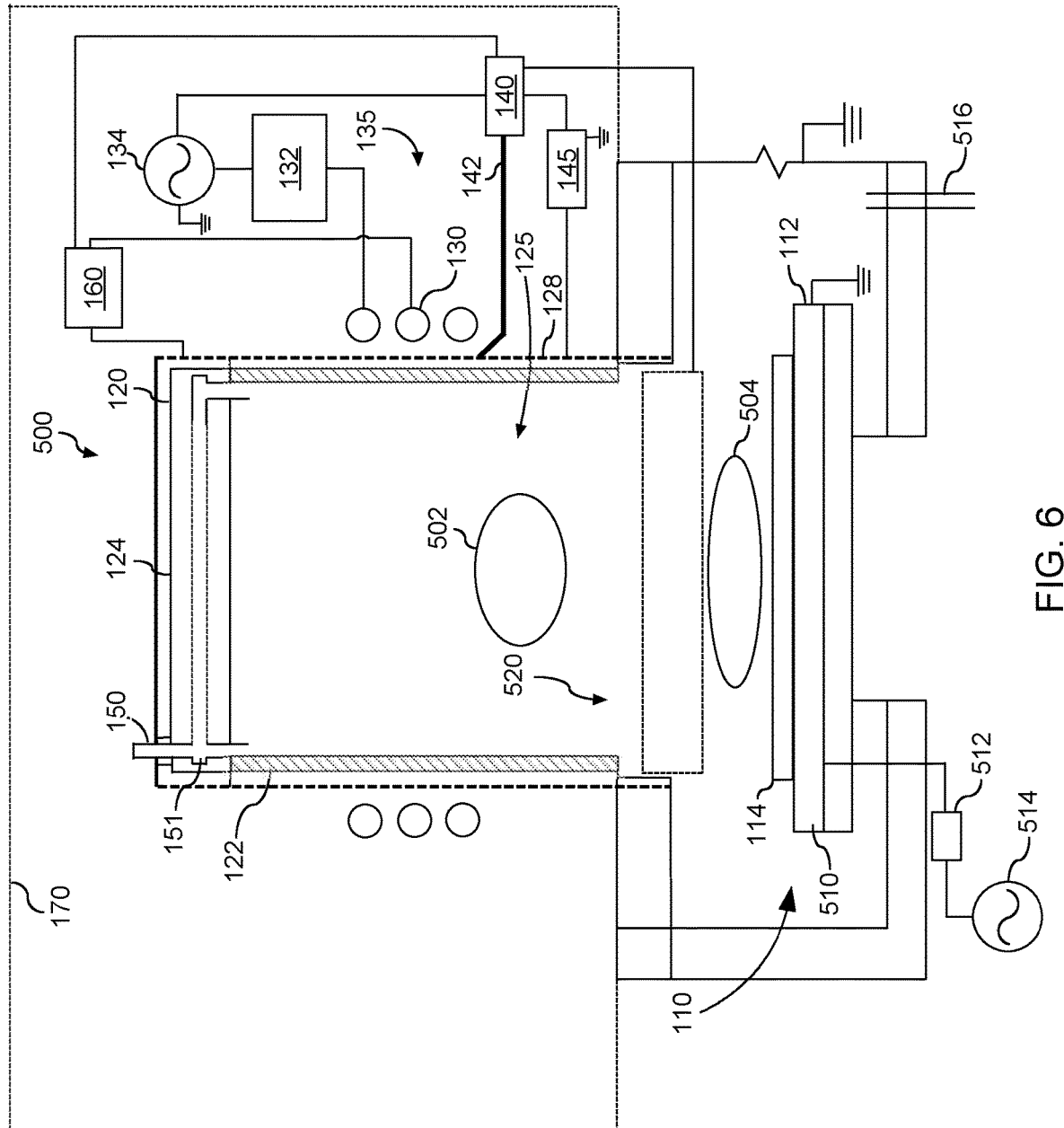
FIG. 6 depicts an example plasma processing apparatus according to example embodiments of the present disclosure.

FIG. 6 depicts an example plasma processing apparatus 500 according to example embodiments of the present disclosure. The plasma processing apparatus 500 is similar to the plasma processing apparatus 100 of FIG. 1 and other plasma processing apparatuses (e.g., FIG. 5). For instance, the plasma processing apparatus 500 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 520.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases can be provided to the chamber interior from gas supply 150 and annular gas distribution channel 151 or other suitable gas introduction mechanism. Examples of the process gases can include one or more of oxygen ($O_2$), hydrogen ($H_2$), nitrogen ($N_2$), argon (Ar), helium (He), carbon monoxide (CO), carbon dioxide ($CO_2$), ammonia ($NH_3$), methane ($CH_4$), $H_2O$, chlorine ($Cl_2$), boron tribromide ($BBr_3$), boron trichloride ($BCl_3$), and one or more fluorinated gases including tetrafluoromethane ($CF_4$), nitrogen trifluoride ($NF_3$), sulfur hexafluoride ($SF_6$), hydrogen fluoride (HF), fluorine ($F_2$). When the induction coil 130 is energized with RF power from the RF power generator 134, a plasma can be generated in the plasma chamber 120. In a particular embodiment, the plasma processing apparatus 100 can include a grounded electrostatic shield 128 to reduce capacitive coupling of the induction coil 130 to the plasma. The walls of processing chamber 110 and the pedestal 112 are grounded.

The separation grid 520 separates the plasma chamber 120 from the processing chamber 110. The separation grid 520 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 520 can be a multi-plate separation grid. For instance, the separation grid 520 can include a first grid plate and a second grid plate that are spaced apart in parallel relationship to one another. The first grid plate and the second grid plate can be separated by a distance.

The first grid plate can have a first grid pattern having a plurality of holes. The second grid plate can have a second grid pattern having a plurality of holes. The first grid pattern can be the same as or different from the second grid pattern. Charged particles can recombine on the walls in their path through the holes of each grid plate in the separation grid. Neutral species (e.g., radicals) can flow relatively freely through the holes in the first grid plate and the second grid plate. The size of the holes and thickness of each grid plate can affect transparency for both charged and neutral particles.

In some embodiments, the first grid plate can be made of metal (e.g., aluminum) or other electrically conductive material and/or the second grid plate can be made from either an electrically conductive material or dielectric material (e.g., quartz, ceramic, etc.). In some embodiments, the first grid plate and/or the second grid plate can be made of other materials, such as silicon or silicon carbide. In the event a grid plate is made of metal or other electrically conductive material, the grid plate can be grounded.

In some embodiments, as discussed above in FIGS. 1 and 5, the separation grid assembly 520 can be replaced by the separation grids 210. The controller 140 can control bias voltage of the separation grid 520 to be varied from process to process or step to step within processing for a single workpiece 114.

The example plasma processing apparatus 500 of FIG. 6 is operable to generate a first plasma 502 (e.g., a remote plasma) in the plasma chamber 120 and a second plasma 504 (e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

For instance, the plasma processing apparatus 500 of FIG. 6 includes a bias source having bias electrode 510 in the pedestal 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The processing chamber 110 can include a gas exhaust port 516 for evacuating a gas from the processing chamber 110. The workpiece 114 can be processed using the first plasma 502 and/or the second plasma 504. Further, there may be supplemental power provided to the second plasma 504 in some embodiments having a separation grid, by tuning the shield for the first plasma to have a substantial shield voltage of about 50 $V_{RMS}$ or more, secondary plasma discharges can occur in the holes of the separation grid that will contribute to the density and power of the second plasma 504. In embodiments having a separation grid but not having a second RF power generator, operation of the first plasma in chamber 120 in a mode wherein the shield voltage is greater than about 50 $V_{RMS}$ will provide plasma 504 due to charged particle and energy inputs from the secondary plasmas in the holes of the separation grid. Said plasma will have a low space potential with minimal RF modulation, and be appropriate for certain process conditions.

According to example aspects of the present disclosure, as can be seen in FIG. 6, the electrostatic shield 128 is located between the induction coil 130 and the dielectric side wall 122. The electrostatic shield 128 is connected to electrical ground via a first tunable reactive circuit 145. The first tunable reactive circuit 145 can include a reactive element whose impedance is variable. The variable impedance can be provided by a series LC circuit with a variable capacitor and/or variable inductor to allow the impedance of the first tunable reactive circuit 145 to be varied over a wide range from about 10 Ohms or less to a value of at least about 50 Ohms, and possibly more than about 100 Ohms at an operating frequency. The electrostatic shield 128 in some embodiments may also be connected to the ceiling 124 of the plasma chamber 120 such that the ceiling 124 can conduct RF current to/from the plasma generated by the induction coil 130 directly or through a thin dielectric liner (not shown in FIG. 6) to the electrostatic shield 128 and then to ground through the first tunable reactive circuit 145.

According to example aspects of the present disclosure, as can be seen in FIG. 6, the electrostatic shield 128 is also connected to the induction coil 130 through a second tunable reactive circuit 160. The second tunable reactive circuit 160 can include a variable impedance. The variable impedance can be provided by a series LC circuit with a variable capacitor and/or variable inductor to allow the impedance of the second tunable reactive circuit 160 to be varied over a wide range.

As can be seen in FIG. 6, the plasma processing apparatus 500 further includes a controller 140 and a voltage sensor 142. The controller 140 controls the RF power generator 134, the first tunable reactive circuit 145, and the second tunable reactive circuit 160 to adjust a plasma potential based on a voltage of the electrostatic shield 128. The voltage sensor 142 measures a voltage of the electrostatic shield 128, in some embodiments where it is nearest to the induction coil 130, and provides signals indicative of the measured voltage of the electrostatic shield 128 to the controller 140. In some embodiments, the controller 140 can control the RF power generator 134, the first tunable reactive circuit 145, and the second tunable reactive circuit 160 based on a "recipe" for the process conditions, including a range of voltages for the signals received from the voltage sensor 142.

In some embodiments, the controller 140 can adjust the voltage of the electrostatic shield 128 among a range between less than about 10 $V_{RMS}$ to about 200 $V_{RMS}$ or more by adjusting an impedance of the first tunable reactive circuit 145 from about 10 Ohms to at least 100 Ohms at a principal frequency of RF current provided by the induction coil 130 and further adjusting the second tunable reactive circuit 160. In some embodiments, the controller 140 can adjust reactive impedances of both first and second reactive impedance circuits to adjust the RF voltage on the electrostatic shield for a particular process step to provide desired level of ion bombardment for that process step.

The controller 140 and/or any of the controllers or other control devices disclosed here can include one or more processors and one or more memory devices. The one or more memory devices can store computer-readable instructions that when executed by the one or more processors to perform operations. The operations can include, for instance, tuning the variable impedance coupled between the electrostatic shield 128 and ground, and/or tuning the variable impedance coupled between the electrostatic shield 128 and the induction coil 130. The operations can include, for instance, controlling the RF generator 134. The controller 140 can perform other operations associated with the plasma processing apparatus.

Figure 7:
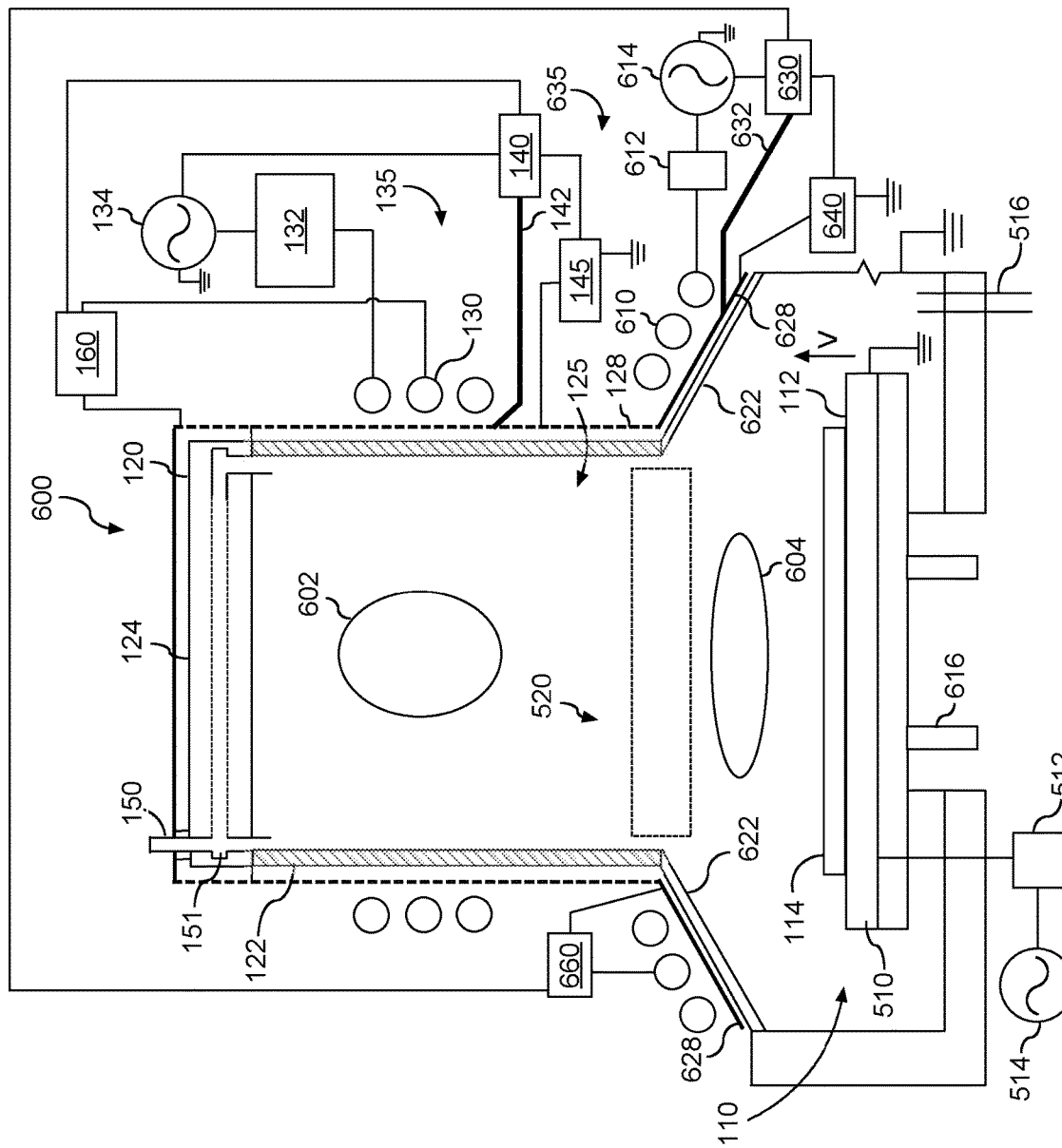
FIG. 7 depicts an example plasma processing apparatus according to example embodiments of the present disclosure.

FIG. 7 depicts an example plasma processing apparatus 600 according to example embodiments of the present disclosure. The upper source of processing chamber 600 is similar to that of FIG. 1, FIG. 5 and FIG. 6, but this chamber includes a lower inductively coupled plasma source in the processing chamber in addition to the inductively coupled source for the upper chamber. This allows the upper plasma source to produce neutral reactive species for the process while the lower source produces both neutral reactive species and ions that may support the processing of the substrate. These two sources may be operated independently so that the appropriate species, both charged and neutral can be produced.

For instance, plasma processing apparatus 600 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an upper inductively coupled plasma source 135 and desired species are channeled from the plasma chamber 120 to the surface of substrate 114 through a separation grid assembly 520.

The plasma chamber 120 includes a dielectric side wall 122 and a top cap or ceiling 124 having a ceiling that forms the top confining surface for the plasma. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas can be provided to the chamber interior from gas supply 150 and annular gas distribution channel 151 or other suitable gas introduction mechanism. Examples of the process gases can include one or more of oxygen ($O_2$), hydrogen ($H_2$), nitrogen ($N_2$), argon (Ar), helium (He), carbon monoxide (CO), carbon dioxide ($CO_2$), ammonia ($NH_3$), methane ($CH_4$), $H_2O$, chlorine ($Cl_2$), boron tribromide ($BBr_3$), boron trichloride ($BCl_3$), and one or more fluorinated gases including tetrafluoromethane ($CF_4$) or other flourocarbons, nitrogen trifluoride ($NF_3$), sulfur hexafluoride ($SF_6$), hydrogen fluoride (HF), fluorine ($F_2$). When the induction coil 130 is energized with RF power from the RF power generator 134, a plasma can be generated in the plasma chamber 120. In a particular embodiment, the plasma processing apparatus 100 can include a grounded electrostatic shield 128 to reduce capacitive coupling of the induction coil 130 to the plasma.

The separation grid 520 separates the plasma chamber 120 from the processing chamber 110. The separation grid 520 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 520 can be a multi-plate separation grid. For instance, the separation grid 520 can include a first grid plate and a second grid plate that are spaced apart in parallel relationship to one another. The first grid plate and the second grid plate can be separated by a distance.

The first grid plate can have a first grid pattern having a plurality of holes. The second grid plate can have a second grid pattern having a plurality of holes. The first grid pattern can be the same as or different from the second grid pattern. Charged particles can recombine on the walls in their path through the holes of each grid plate in the separation grid. Neutral species (e.g., radicals) can flow relatively freely through the holes in the first grid plate and the second grid plate. The size of the holes and thickness of each grid plate can affect transparency for both charged and neutral particles.

In some embodiments, the first grid plate can be made of metal (e.g., aluminum) or other electrically conductive material and/or the second grid plate can be made from either an electrically conductive material or dielectric material (e.g., quartz, ceramic, etc.). In some embodiments, the first grid plate and/or the second grid plate can be made of other materials, such as silicon or silicon carbide. In the event a grid plate is made of metal or other electrically conductive material, the grid plate can be grounded.

In some embodiments, as discussed above in FIGS. 1 and 5, the separation grid assembly 520 can be replaced by the separation grids 210. The controller 140 can control bias voltage of the separation grid 520 (connection not shown) to be varied from process to process or step to step within processing for a single workpiece 114.

The example plasma processing apparatus 600 of FIG. 7 is operable to generate a first plasma 602 (e.g., a remote plasma) in the plasma chamber 120 and a second plasma 604 (e.g., a direct plasma) in the processing chamber 110 and adjacent the substrate. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can have a second inductive coupling element (inductive coupling element) located proximate the dielectric sidewall 622. The induction coil 610 of the second inductive plasma source 635 may be coupled to an RF generator 614 via a suitable matching network 612. The induction coil 610, when energized with RF energy, can induce a direct plasma 604 adjacent the substrate from a mixture in the processing chamber 110. An electrostatic shield 628 (e.g., a Faraday shield, or a shield having conducting material) can be disposed between the induction coil 610 and the sidewall 622.

The pedestal 112 can be movable in a vertical direction V. For instance, the pedestal 112 can include a vertical lift 616 that can be configured to adjust a distance between the pedestal 112 and the separation grid assembly 200. As one example, the pedestal 112 can be located in a first vertical position for processing using the remote plasma 602. The pedestal 112 can be in a second vertical position for processing using the direct plasma 604. The first vertical position can be closer to the separation grid assembly 200 relative to the second vertical position.

The plasma processing apparatus 600 of FIG. 7 includes a bias source having bias electrode 510 in the pedestal 112. The bias electrode 510 can be coupled to an RF power generator 514 via a suitable matching network 512. The processing chamber 110 can include a gas exhaust port 516 for evacuating a gas from the processing chamber 110. Hydrogen radicals can be generated using the first plasma 602 and/or the second plasma 604. The processing chamber 110 and the pedestal 112 are grounded.

According to example aspects of the present disclosure, as can be seen in FIG. 7, the electrostatic shield 128 is located between the induction coil 130 and the dielectric side wall 122. The electrostatic shield 128 is grounded via a first tunable reactive circuit 145. The first tunable reactive circuit 145 can include a variable impedance. The variable impedance can be provided by a series LC circuit with a variable capacitor and/or variable inductor to allow the impedance of the first tunable reactive circuit 145 to be varied over a wide range from about 10 Ohms to a value of at least about 100 Ohms. The electrostatic shield 128 may also be connected to the ceiling 124 of the plasma chamber 120 such that the ceiling 124 can conduct RF current to/from the plasma generated by the induction coil 130 directly or through a thin dielectric liner (not shown in FIG. 7) to the electrostatic shield 128 and then to ground through the first tunable reactive circuit 145.

According to example aspects of the present disclosure, as can be seen in FIG. 7, the electrostatic shield 128 is also connected to the induction coil 130 through a second tunable reactive circuit 160. The second tunable reactive circuit 160 can include a variable impedance. The variable impedance can be provided by a series LC circuit with a variable capacitor and/or variable inductor to allow the impedance of the second tunable reactive circuit 160 to be varied over a wide range.

As can be seen in FIG. 7, the plasma processing apparatus 500 further includes a controller 140 and a voltage sensor 142. The controller 140 controls the RF power generator 134, the first tunable reactive circuit 145, and the second tunable reactive circuit 160 to adjust a plasma potential based on a voltage of the electrostatic shield 128. The voltage sensor 142 measures a voltage of the electrostatic shield 128, in some embodiments where it is nearest to the induction coil 130, and provides signals indicative of the measured voltage of the electrostatic shield 128 to the controller 140. In some embodiments, the controller 140 can control the RF power generator 134, the first tunable reactive circuit 145, and the second tunable reactive circuit 160 based on a "recipe" for the process conditions, including a range of voltages for the signals received from the voltage sensor 142.

In some embodiments, the controller 140 can adjust the voltage of the electrostatic shield 128 among a range between less than about 1 $V_{RMS}$ to about 200 $V_{RMS}$ by adjusting an impedance of the first tunable reactive circuit 145 from about 10 Ohm to 100 Ohms or more at a principal frequency of RF current provided by the induction coil 130 and further adjusting the second tunable reactive circuit 160. In some embodiments, the controller 140 can adjust reactive impedances of both first and second reactive impedance circuits to adjust the RF voltage on the electrostatic shield for a particular process step to provide desired level of ion bombardment for that process step.

The controller 140 and/or any of the controllers or other control devices disclosed here can include one or more processors and one or more memory devices. The one or more memory devices can store computer-readable instructions that when executed by the one or more processors to perform operations. The operations can include, for instance, tuning the variable impedance coupled between the electrostatic shield 128 and ground, and/or tuning the variable impedance coupled between the electrostatic shield 128 and the induction coil 130. The operations can include, for instance, controlling the RF generator 134. The controller 140 can perform other operations associated with the plasma processing apparatus.

According to example aspects of the present disclosure, as can be seen in FIG. 7, the electrostatic shield 628 is connected located between the induction coil 610 and the dielectric side wall 622. The electrostatic shield 628 is grounded (e.g., via a grounded enclosure) via a third tunable reactive circuit 640. The third tunable reactive circuit 640 can include a variable impedance. The variable impedance can be provided by a series LC circuit with a variable capacitor to allow the impedance of the third tunable reactive circuit 640 to be varied over a wide range from about 10 Ohms to a value of at least about 50 Ohms, e.g., more than about 100 Ohms.

According to example aspects of the present disclosure, as can be seen in FIG. 7, the electrostatic shield 628 may also be connected to the induction coil 610 through a fourth tunable reactive circuit 660. The fourth tunable reactive circuit 660 can include a variable impedance. The variable impedance can be provided by a series LC circuit with a variable capacitor to allow the impedance of the fourth tunable reactive circuit 660 to be varied over a wide range.

As can be seen in FIG. 7, the plasma processing apparatus 600 further includes a controller 630 and a voltage sensor 632. The controller 630 controls the RF power generator 614, the third tunable reactive circuit 640, and the fourth tunable reactive circuit 660 to adjust a plasma potential based on a voltage of the electrostatic shield 628. The voltage sensor 632 measures a voltage of the electrostatic shield 628, in some embodiments where it is nearest to the induction coil 610, and provides signals indicative of the measured voltage of the electrostatic shield 628 to the controller 630. In some embodiments, the controller 630 can control the RF power generator 614, the third tunable reactive circuit 640, and the fourth tunable reactive circuit 660 based on a "recipe" for the process conditions, including a range of voltages for the signals received from the voltage sensor 632.

In some embodiments, the controller 630 can adjust the voltage of the electrostatic shield 628 among a range between less than about 10 $V_{RMS}$ to about 200 $V_{RMS}$ by adjusting an impedance of the third tunable reactive circuit 640 from about 10 Ohm to 100 Ohms at a principal frequency of RF current provided by the induction coil 610 and further adjusting the fourth tunable reactive circuit 660. In some embodiments, the controller 630 can adjust reactive impedances of both third and fourth reactive impedance circuits to adjust the RF voltage on the electrostatic shield for a particular process step to provide desired level of ion bombardment for that process step, even in the absence of separate bias power.

In some embodiments, the controller 630 can control the voltage of the electrostatic shield 628 to be greater than about 20 $V_{RMS}$. The plasma ignition can be aided by the resulting RF electric field that is set up at the dielectric side wall 622 adjacent the electrostatic shield 628. The voltage sensor 632 can measure the voltage of the electrostatic shield 628 and can provide a measured voltage of the electrostatic shield 628 to the controller 630. The controller 630 can adjust the voltage of the electrostatic shield 628 by adjusting the variable impedance of the circuit 640 based on a measured voltage of the electrostatic shield 628 provided by the voltage sensor 632 to provide for closed loop control.

In some embodiments, the controller 630 can adjust the voltage of the electrostatic shield 628 among a range between less than about 10 $V_{RMS}$ to about 100 $V_{RMS}$ by adjusting an impedance of the variable impedance of the circuit 640 from less than about 10 Ohms to an inductive reactance equal in magnitude to the reactance of the free space capacitance between the shield 628 and ground. In some embodiments, total impedance from the shield 628 to ground can be adjustable over a substantial range that can include values less than about 10 Ohms, or values greater than about 100 Ohms at frequency of RF current provided by the induction coil 610. The controller 630 can tune the variable impedance of the circuit 640 and the circuit 612 to values such that the voltage of the electrostatic shield 628 can be in an acceptable range. For instance, the controller 630 can compare a measured voltage of the electrostatic shield 628 with a desired voltage of the electrostatic shield 628 to adjust variable impedance of the circuit 640 until the measured value is in an acceptable range (e.g., equal to a desired voltage).

The controller 630 and/or any of the controllers or other control devices disclosed here can include one or more processors and one or more memory devices. The one or more memory devices can store computer-readable instructions that when executed by the one or more processors to perform operations. The operations can include, for instance, tuning the variable impedance 640 coupled between the electrostatic shield 628 and ground, and/or tuning the variable impedance 660 coupled between the electrostatic shield 628 and the induction coil 610. The operations can include, for instance, controlling the RF generator 614. The controller 630 can perform other operations associated with the plasma processing apparatus.

Figure 8:
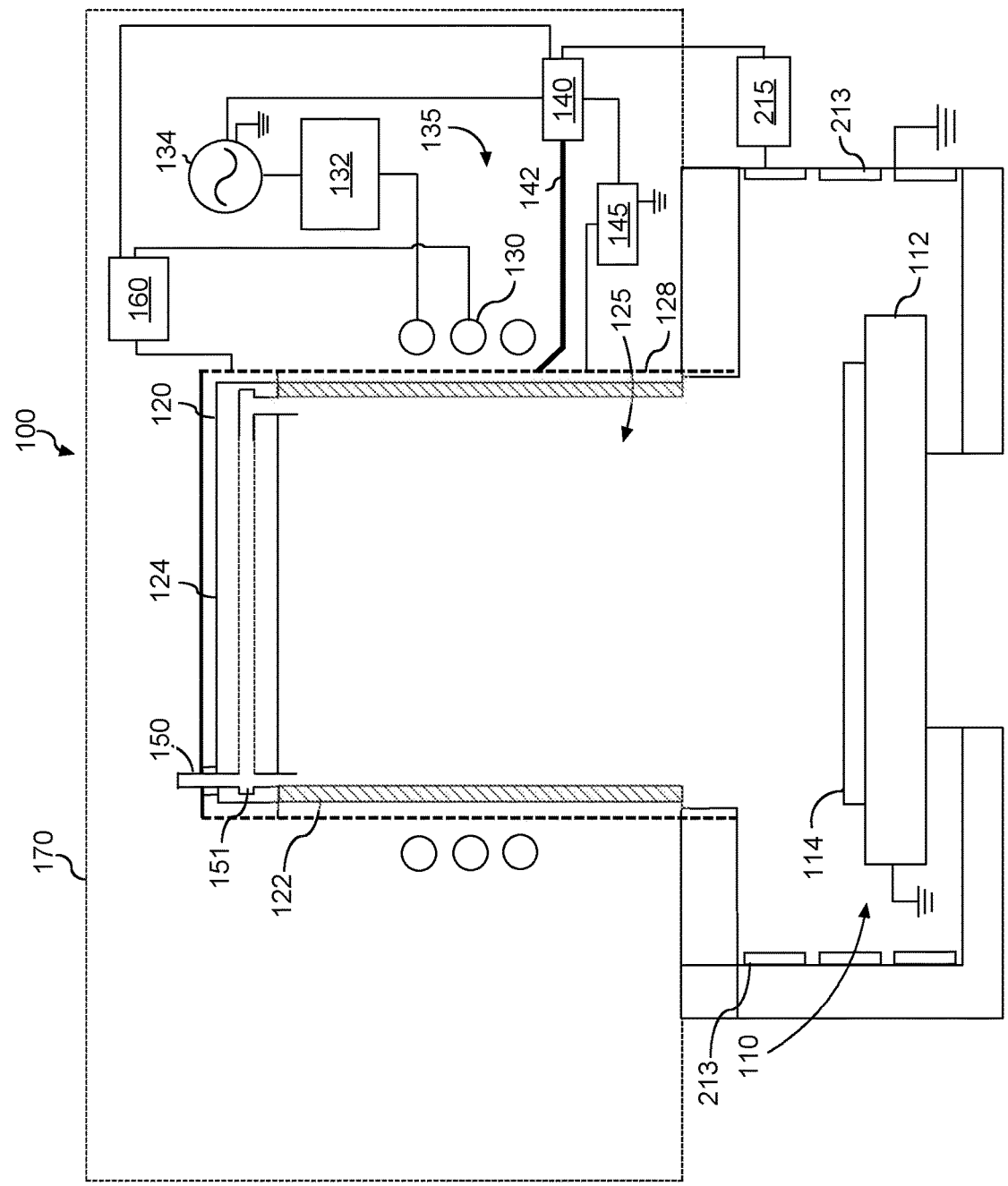
FIG. 8 depicts an example plasma processing apparatus according to example embodiments of the present disclosure.

FIG. 8 depicts a plasma processing apparatus 100 similar to the plasma processing apparatus 100 of FIG. 1. Instead of a baffle structure 200 as shown in FIG. 1, the plasma processing apparatus 100 of FIG. 8 includes a plurality of dielectric restricting element 213. The dielectric restricting elements can be separated by a gap. The gap can be less than about 1 cm in width. The dielectric restricting element 213 can be dielectric chamber liners mounted generally parallel (e.g., within 15° of parallel) with a grounded side wall of the processing chamber 110.

Example impedance matching network capacitor settings ($C_{Tune}$ and $C_{Load}$) for providing power to an inductively coupled plasma source with an electrostatic shield, along with impedances (e.g., impedances of first and second tunable reactive circuits connected respectively between an electrostatic shield and an induction coil ($Z_{SHIELD\text{-}COIL}$), and between the electrostatic shield and a ground reference ($Z_{SHIELD\text{-}GROUND}$) and example shield voltages ($V_{SHIELD}$) for example operation modes are listed in Table 1 below:

Case No. 1: the first and second reactive circuits are adjusted to produce a series resonance of an inductor and a capacitor within the first tunable reactive impedance circuit and a parallel resonance between the second tunable reactive impedance circuit and $C_A$;

Case No. 2: the first tunable reactive circuit is adjusted to a condition of series resonance between the inductive and capacitive components in that circuit resulting in a low impedance from the shield to ground, while the second tunable reactive impedance circuit from the inductive coupling element to the electrostatic shield is adjusted to have large (>200 Ohms) inductive reactance;

Case No. 3: As if the first and second reactive circuits are entirely absent, or both tunable circuits are adjusted to have very large inductive reactance while both stray capacitances, $C_S$ and $C_A$ have typical values;

Case No. 4: the first reactive circuits is adjusted to have parallel resonance stray capacitance ($C_S$) from the electrostatic shield to the ground reference, while the second tunable reactive circuit is tuned for high inductive reactance or is absent;

Case No. 5: the first reactive circuit is tuned to parallel resonance with $C_S$ and the second reactive circuit is adjusted to produce a net 150 pf shunt capacitance from the induction coil to the electrostatic shield;

Case No. 6: the first reactive circuit is tuned to parallel resonance with $C_S$ and second reactive circuit is adjusted to produce a net 300 pf shunt capacitance from the induction coil to the electrostatic shield;

TABLE 1

| Case No. | $C_{TUNE}$ (pf) | $C_{LOAD}$ (pf) | $Z_{SHIELD\text{-}COIL}$ (W) | $Z_{SHIELD\text{-}GROUND}$ (W) | $V_{SHIELD}$ (V) |
|---|---|---|---|---|---|
| 1 | 81 | 240 | >3000 (second tunable circuit in parallel resonance with $C_A$) | <10 | 0.1 |
| 2 | 80 | 220 | 260 (45 pf) | 10 Series Resonance in first tunable circuit | 2.3 |
| 3 | 80 | 210 | 260 (45 pf) | 50 (234 pf) | 33 |
| 4 | 80 | 210 | 260 (45 pf) | >500 (first tunable circuit in parallel resonance with $C_S$) | 68 |
| 5 | 77 | 180 | 78 | >500 (first tunable circuit in parallel resonance with $C_S$) | 206 |
| 6 | 77 | 140 | 39 | >500(first tunable circuit in parallel resonance with $C_S$) | 292 |

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method for processing a workpiece, comprising:
    admitting a process gas into a plasma chamber;
    exciting with RF energy an inductive coupling element to initiate plasma in the process gas;
    adjusting an RF voltage of an electrostatic shield located between the inductive coupling element and the plasma chamber, the electrostatic shield having a stray capacitance to a ground reference; and
    conducting an ion-assisted etching process on the workpiece based at least in part on the RF voltage of the electrostatic shield;
    wherein adjusting the RF voltage of the electrostatic shield comprises:
        adjusting a first tunable reactive impedance circuit coupled between the electrostatic shield and a ground reference to a condition of inductive reactance such that, in the absence of plasma, a total impedance between the electrostatic shield and the ground reference has a magnitude that is at least twice a magnitude of an impedance of the stray capacitance between the electrostatic shield and the ground reference at a frequency of the RF energy supplied to the inductive coupling element; and
        adjusting a second tunable reactive impedance circuit coupled between the electrostatic shield and the inductive coupling element to produce a total impedance, in the absence of plasma, between electrostatic shield and the inductive coupling element having a magnitude that is less than half a magnitude of an impedance of a stray capacitance between the electrostatic shield and the inductive coupling element.

2. The method of claim 1, wherein adjusting the RF voltage of the electrostatic shield comprises:
    adjusting the first tunable reactive impedance circuit coupled between the electrostatic shield and a ground reference such that the first tunable reactive impedance circuit produces a parallel resonance condition with the stray capacitance from the electrostatic shield to the ground reference at the frequency of the RF energy supplied to the inductive coupling element.

3. The method of claim 1, wherein the RF voltage of the electrostatic shield is adjusted to be greater than about 100 VRMS.

4. The method of claim 1, wherein the first tunable reactive impedance circuit comprises an inductor and a capacitor coupled in series.

5. The method of claim 3, wherein the second tunable reactive impedance circuit comprises an inductor and a capacitor coupled in series.

6. The method of claim 1, wherein the stray capacitance from the electrostatic shield to the ground reference is in a range of about 20 picofarads to about 2000 picofarads.

7. A method for processing a workpiece, comprising:
    admitting a process gas into a plasma chamber;
    exciting with RF energy an inductive coupling element to cause ignition of a plasma in the process gas;
    adjusting an RF voltage of an electrostatic shield located between the inductive coupling element and the plasma, wherein the electrostatic shield has a stray capacitance to a ground reference; and
    conducting an isotropic etching process on the workpiece based at least in part on the RF voltage of the electrostatic shield;
    wherein adjusting the RF voltage of the electrostatic shield comprises:
        adjusting a first tunable reactive impedance circuit coupled between the electrostatic shield and the ground reference to have a net capacitive reactance such that the first tunable reactive impedance circuit, in the absence of plasma, produces a total impedance between the electrostatic shield and the ground reference that is less than half a magnitude of an impedance of the stray capacitance between the electrostatic shield and ground reference at a frequency of the RF energy supplied to the inductive coupling element; and adjusting a second tunable reactive impedance circuit coupled between the electrostatic shield and the inductive coupling element to produce a net inductive reactance of that has parallel resonance with the stray capacitance between shield and inductive coupling element at the frequency of the RF energy supplied to the inductive coupling element.

8. The method of claim 7, wherein adjusting the RF voltage of the electrostatic shield comprises:

adjusting the first tunable reactive impedance circuit coupled between the electrostatic shield and the ground reference such that the first tunable reactive impedance circuit produces a series resonance condition with the stray capacitance from the electrostatic shield to the ground reference at the frequency of the RF energy supplied to the inductive coupling element.

9. The method of claim 7, wherein adjusting the RF voltage of the electrostatic shield comprises:

adjusting a second tunable reactive impedance circuit coupled between the electrostatic shield and a ground reference to produce a series resonance condition at the frequency of the RF energy supplied to the inductive coupling element.

10. The method of claim 7, wherein the RF voltage of the electrostatic shield is adjusted to be less than or equal to about 10 $V_{RMS}$.

11. The method of claim 7, wherein an impedance of the first tunable reactive impedance circuit is set to be less than or equal to about 5 Ohms at a frequency of the RF energy supplied to the inductive coupling element.

12. The method of claim 7, wherein a stray capacitance from the inductive coupling element to the electrostatic shield is in a range of about 5 picofarads to about 1000 picofarads.

13. A method for processing a workpiece, comprising:

admitting a process gas into a plasma chamber;

exciting with RF energy an inductive coupling element to ignite a plasma in the process gas;

adjusting an RF voltage of an electrostatic shield disposed between an inductive coupling element and the plasma chamber to obtain a first RF voltage of the electrostatic shield, the electrostatic shield having a stray capacitance to a ground reference;

conducting an ion-assisted etching process on the workpiece based at least in part on the first RF voltage of the electrostatic shield;

adjusting the RF voltage of the electrostatic shield to obtain a second RF voltage of the electrostatic shield; and conducting an isotropic etching process on the workpiece based at least in part on the second RF voltage of the electrostatic shield;

wherein adjusting the RF voltage of the electrostatic shield to obtain the first RF voltage of the electrostatic shield comprises adjusting a first tunable reactive impedance circuit coupled between the electrostatic shield and a ground reference such that at a total impedance in the absence of plasma between the electrostatic shield and the ground reference is a first magnitude; and wherein adjusting the RF voltage of the electrostatic shield to obtain the second RF voltage of the electrostatic shield comprises adjusting the first tunable reactive impedance circuit coupled between the electrostatic shield and a ground reference such that at a total impedance in the absence of plasma between the electrostatic shield and the ground reference is a second magnitude;

wherein the second magnitude is less than the first magnitude.

14. The method of claim 13, wherein adjusting the RF voltage of the electrostatic shield to obtain the first RF voltage of the electrostatic shield comprises adjusting a second tunable reactive impedance circuit coupled between the electrostatic shield and the inductive coupling element such that a total impedance in the absence of plasma between the electrostatic shield and the inductive coupling element is a third magnitude; and wherein adjusting the RF voltage of the electrostatic shield to obtain the second RF voltage of the electrostatic shield comprises adjusting the second tunable reactive impedance circuit coupled between the electrostatic shield and the inductive coupling element such that at a total impedance between the electrostatic shield and the inductive coupling element is a fourth magnitude;

wherein the third magnitude is less than the fourth magnitude.

15. The method of claim 13, wherein the first RF voltage of the electrostatic shield is greater than about 100 $V_{RMS}$, and the second RF voltage is less than about 10 $V_{RMS}$.

16. The method of claim 13, wherein conducting the ion-assisted etching process is implemented at a setting of the first tunable reactive impedance circuit such that the total impedance in the absence of plasma of the electrostatic shield to the ground reference is greater than about 100 Ohms at a frequency of the RF energy supplied to the inductive coupling element, and conducting the isotropic etching process is implemented at a second impedance of the first tunable reactive impedance circuit of less than about 10 Ohms at the frequency of the RF energy supplied to the inductive coupling element.

17. The method of claim 14, wherein the first tunable reactive impedance circuit comprises a first inductor and a first capacitor coupled in series; and the second tunable reactive impedance circuit comprises a second inductor and a second capacitor coupled in series.

18. The method of claim 17, wherein at least one of the first inductor and the first capacitor is tunable and at least one of the second inductor and the second capacitor is tunable.

* * * * *